United States Patent
Ninomiya et al.

(10) Patent No.: US 8,980,654 B2
(45) Date of Patent: Mar. 17, 2015

(54) ION IMPLANTATION METHOD AND ION IMPLANTATION APPARATUS

(71) Applicant: SEN Corporation, Tokyo (JP)

(72) Inventors: Shiro Ninomiya, Ehime (JP); Akihiro Ochi, Ehime (JP)

(73) Assignee: SEN Corporation, Tokyo (JP)

( * ) Notice: Subject to any disclaimer, the term of this patent is extended or adjusted under 35 U.S.C. 154(b) by 9 days.

(21) Appl. No.: 13/939,908

(22) Filed: Jul. 11, 2013

(65) Prior Publication Data

US 2014/0017825 A1    Jan. 16, 2014

(30) Foreign Application Priority Data

Jul. 12, 2012  (JP) ................. 2012-156935

(51) Int. Cl.
| | | |
|---|---|---|
| H01L 21/265 | (2006.01) | |
| H01J 37/302 | (2006.01) | |
| H01J 37/304 | (2006.01) | |
| H01J 37/317 | (2006.01) | |

(52) U.S. Cl.
CPC ........... *H01L 21/265* (2013.01); *H01J 37/3023* (2013.01); *H01J 37/304* (2013.01); *H01J 37/3171* (2013.01); *H01J 2237/30483* (2013.01)
USPC ............. 438/17; 438/514; 438/534; 438/270; 438/478; 438/25; 438/108; 438/128; 438/172; 250/427; 250/423 R

(58) Field of Classification Search
CPC ...................... H01L 29/1068; H01L 21/02238; H01L 21/02529; H01L 21/02546; H01L 21/02603; H01L 21/02617
USPC ........... 438/17, 480, 506, 514, 519, 527, 536, 438/659, 766, FOR. 154, FOR. 161, 534; 250/492.21
See application file for complete search history.

(56) References Cited

U.S. PATENT DOCUMENTS

| | | | | |
|---|---|---|---|---|
| 5,046,148 | A  * | 9/1991 | Nogami et al. ............. | 250/492.2 |
| 6,423,976 | B1 * | 7/2002 | Glavish et al. ............ | 250/492.21 |
| 6,903,350 | B1 * | 6/2005 | Vanderberg et al. ...... | 250/492.21 |
| 8,368,036 | B2 * | 2/2013 | Hino ......................... | 250/492.21 |

FOREIGN PATENT DOCUMENTS

| | | |
|---|---|---|
| JP | 3125384 B2 | 1/2001 |
| JP | 2008-262756 A | 10/2008 |
| JP | 2011-258353 A | 12/2011 |

* cited by examiner

*Primary Examiner* — Michael Trinh
*Assistant Examiner* — Damian A Hillman
(74) *Attorney, Agent, or Firm* — Rader, Fishman & Grauer PLLC

(57) ABSTRACT

The ion implantation method includes setting an ion beam scanning speed and a mechanical scanning speed of an object during ion implantation using hybrid scan in advance and implanting ions based on the set ion beam scanning speed and the set mechanical scanning speed of the object. In the setting in advance, each of the ion beam scanning speeds is set based on each of ion beam scanning amplitudes changing severally according to a surface outline of an object which is irradiated with the ions so that an ion beam scanning frequency is maintained constant for any of ion beam scanning amplitudes, and the mechanical scanning speed of the object corresponding to the ion beam scanning speed is set so that an ion implantation dose per unit area to be implanted into the surface of the object is maintained constant.

10 Claims, 16 Drawing Sheets

100

100

ION IMPLANTATION METHOD AND ION IMPLANTATION APPARATUS

BACKGROUND OF THE INVENTION

1. Field of the Invention

The present invention relates to ion implantation, and more particularly, to an ion implantation method and an ion implantation apparatus.

2. Description of the Related Art

In semiconductor manufacturing processes, a process for implanting ions into a semiconductor wafer is performed in a standard procedure for the purpose of changing conductivity, changing a crystalline structure of the semiconductor wafer, or the like. An apparatus used in this process is generally called an ion implantation apparatus.

The ion implantation apparatus is configured so that, for example, an ion source, an extraction electrode, a mass analysis magnet device, a mass analysis slit, an acceleration/deceleration device, a wafer processing chamber, and the like are arranged along a beamline so as to implant ions into a wafer which is a semiconductor substrate.

In general, since the cross-sectional area of an ion beam with which a wafer is irradiated is smaller than the size of the wafer, several irradiation methods for irradiating the entire surface of the wafer with the ion beam have been contrived. As an example of the irradiation method, there is a known method of performing ion implantation on the entire surface of the wafer by scanning the wafer with an ion beam in one direction and allowing the wafer to be reciprocally scanned in the direction perpendicular to the ion beam scanning direction.

In addition, as one of means for controlling an implantation dose in an ion implantation area, there is a contrived ion implantation apparatus where a plurality of ion beam detectors performing current detection in an X-direction (ion beam scanning direction) are installed behind a platen mounting wafers and an automatic X-scanning width controller automatically controlling an X-scanning width and an automatic Y-scanning speed controller automatically controlling a Y-scanning speed (wafer movement speed) are included.

In addition, similarly, as another means for controlling an implantation dose in an ion implantation area, there is a contrived method of measuring a beam current amount during ion implantation and automatically correcting and tracking a Y-direction (wafer movement direction) speed of a mechanical scanning device based on the measured beam current amount.

SUMMARY OF THE INVENTION

According to an aspect of the present invention, there is provided an ion implantation method as an ion implantation method, including: setting an ion beam scanning speed and a mechanical scanning speed of an object during ion implantation using hybrid scan in advance; and implanting ions based on the set ion beam scanning speed and the set mechanical scanning speed of the object. In the setting in advance, each of the ion beam scanning speeds is set based on each of ion beam scanning amplitudes changing severally according to a surface outline of an object which is irradiated with the ions so that an ion beam scanning frequency is maintained constant for any of ion beam scanning amplitudes, and the mechanical scanning speed of the object corresponding to the ion beam scanning speed is set so that an ion implantation dose per unit area to be implanted into the surface of the object is maintained constant.

According to another aspect of the present invention, there is provided an ion implantation apparatus. The ion implantation apparatus includes: a holding unit which retains an object; a beam scanning unit which is configured to scan a surface of the object with an ion beam; a movement unit which moves the holding unit in a direction intersecting an ion beam scanning direction; and a control unit which sets an ion beam scanning speed and a mechanical scanning speed of the object during ion implantation in advance and controls operations of the scanning unit and the movement unit based on the set ion beam scanning speed and the set mechanical scanning speed. While changing each ion beam scanning amplitude according to a surface outline of the object so that an ion beam scanning frequency is maintained constant for any of ion beam scanning amplitudes, the control unit controls the beam scanning unit so that the ion beam scans at a predetermined scanning speed changing according to each scanning amplitude, and the control unit controls the movement unit so as to move the object at the mechanical scanning speed changing according to the ion beam scanning speed.

In addition, an arbitrary combination of the components mentioned hereinbefore or a replacement of the components or expression of the present invention among a method, an apparatus, a system, and the like is also valid as an aspect of the present invention.

DETAILED DESCRIPTION OF THE INVENTION

Figure 1A:
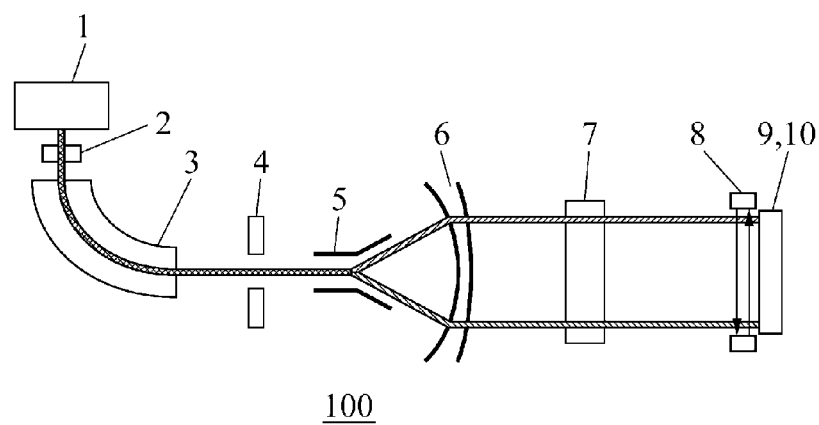
FIG. 1A is a schematic plane diagram illustrating a configuration of a hybrid scanning single-wafer processing type ion implantation apparatus according to an embodiment.

The invention will now be described by reference to the preferred embodiments. This does not intend to limit the scope of the present invention, but to exemplify the invention.

In the above-described ion implantation technique, a beam current amount needs to be measured every scanning in order to automatically correct and track a Y-direction mechanical scanning device speed based on the beam current amount. In this technique, since a time interval when ions are not implanted into a wafer is increased, there is a need for improving efficiency of ion implantation.

The present invention is to provide a technique of implementing ion implantation with good efficiency.

Hereinafter, embodiments of the present invention will be described in detail with reference to the drawings. In the description of the drawings, the same components are denoted by the same reference numerals, and the redundant description thereof is appropriately omitted. The configurations described hereinafter are exemplary ones, and thus, the present invention is not limited thereto. In addition, in the description hereinafter, a semiconductor wafer is exemplified as an object (a workpiece) on which ion implantation is performed. However, other materials or members may be used as the object.

First, a hybrid scanning single-wafer processing type ion implantation apparatus according to an embodiment is described. In semiconductor manufacturing processes, a process for implanting ions into a semiconductor wafer is performed in a standard procedure for the purpose of changing conductivity, changing a crystalline structure of the semiconductor wafer, or the like. An apparatus used in this process is generally called an ion implantation apparatus.

The ion implantation apparatus is an apparatus which transports ions generated by an ion source as an ion beam to an ion implantation area. Herein, the single-wafer processing type ion implantation apparatus is an ion implantation apparatus where, one semiconductor wafer is loaded on the ion implantation area and ion implantation is performed on the semiconductor wafer, and after that, the next semiconductor wafer is loaded and the same process is repeated, so that ion implantation is performed on the number of semiconductor wafers which are scheduled to be processed in this manner. In addition, the hybrid scanning single-wafer processing type ion implantation apparatus is anion implantation apparatus among the single-wafer processing type ion implantation apparatuses, where an electric field or a magnetic field is applied to ions in a space where an ion beam is transported from an ion source to an ion implantation area, so that the ion beam scans in one direction in the ion implantation area space and the semiconductor wafer is reciprocated in the direction perpendicular to the ion beam scanning direction.

In addition, in the hybrid scanning single-wafer processing type ion implantation apparatus, the ion beam scans in one direction, and the semiconductor wafer is scanned in the direction perpendicular to (intersecting) the ion beam scanning direction. However, when the ion implantation into the semiconductor wafer is considered, it is useful to virtually fix the semiconductor wafer and to consider the relative behavior of the ion beam to the semiconductor wafer. Namely, although the semiconductor wafer is scanned in one direction with respect to the ion beam by the semiconductor wafer mechanical scan, if the semiconductor wafer is assumed to exist in a fixed virtual space, it may be considered that the ions transported up to the ion implantation area space form virtual planar ion implantation area in the ion implantation area space by the ion beam scanning and the semiconductor wafer mechanical scanning, and as a result, the ions are implanted entirely into the semiconductor wafer.

In other words, in the hybrid scanning single-wafer processing type ion implantation apparatus, the ion beam scans in one direction in the ion implantation area space by applying a periodically-varying electric field or periodically-varying magnetic field to the ions during the transportation of the ion beam, and the semiconductor wafer is scanned in the direction perpendicular to the ion beam scanning direction. In addition, it may be said that the hybrid scanning single-wafer processing type ion implantation apparatus is an ion implantation apparatus where, since the above-described two types of scanning are used, the relative relationship with respect to the ions implanted into the semiconductor wafer may be regarded as the virtual planar ion implantation area.

In addition, hereinafter, sometimes, the ion beam scanning direction is referred to as an X-scanning direction, and the semiconductor wafer scanning direction is referred to as a Y-scanning direction. Furthermore, with respect to the term "Y-scanning direction", in some cases, the direction perpendicular to the ion beam scanning direction in the above-described virtual planar ion implantation area is referred to as the Y-scanning direction. Like this, the "Y-scanning direction" is the semiconductor wafer mechanical scanning direction in an actual space and the direction perpendicular to the ion beam scanning direction in the above-described virtual planar ion implantation area. However, since this distinguishment is originated from a difference in consideration as to whether the semiconductor wafer is to be driven in the same manner as an actual situation or is to be fixed in the above-described virtual planar ion implantation area, the meaning and content of the direction is the same, and the meaning used in the context is clear. Therefore, hereinafter, the description is made without particular distinguishment.

Recently, in the semiconductor manufacturing, requirements of the ion implantation apparatus have been diversified in accordance with the purposes. Herein, in principle, although the requirements can be achieved by a typical ion implantation apparatus, in some cases, the requirements may be difficult to achieve by an ion implantation apparatus, which is generally developed, due to engineering requirements and market and economic reasons.

As representative examples, there are limitation in size of a semiconductor wafer and limitation in development of an ion implantation apparatus corresponding to the limitation in size of a semiconductor wafer. Hereinafter, this is described in detail.

Currently, the most widely used semiconductor wafer is a silicon semiconductor wafer. With respect to the silicon semiconductor wafers, a 300 mm-diameter semiconductor wafer is widely employed in a semiconductor device mass production process. In addition, currently, in the world, employment of a 450 mm-diameter semiconductor wafer has been considered. On the other hand, with respect to less-than-300 mm-diameter silicon semiconductor wafers, a 200 mm-diameter semiconductor wafer is mainly used for mass production, but the market share is gradually decreased. In addition, a 150 mm-diameter silicon semiconductor wafer is also slightly used in a mass production process.

This situation is very different in non-silicon semiconductor wafers. For example, currently, in some cases, as a wafer mainly used for production of a wide-gap semiconductor power device, a silicon carbide (SiC) semiconductor wafer or gallium nitride (GaN) semiconductor wafer may be used. In general, such a non-silicon semiconductor wafer is hard to have a large diameter, and thus, a 100 mm-or-less-diameter semiconductor wafer is used for mass production process.

However, in the case where the semiconductor wafer is considered in the standpoint of development of the ion implantation apparatus, the existence of a wide range of diameter of the semiconductor wafer is contrary to the market and economics. Namely, since a diameter of a silicon semiconductor wafer was 100 mm or less many years ago, design and development of an ion implantation apparatus dedicated to a silicon carbide (SiC) semiconductor wafer or a gallium nitride (GaN) semiconductor wafer can be available in principle. However, very large cost is needed to develop the ion implantation apparatus, and development of separate ion implantation apparatuses adapted to a wide range of diameters of semiconductor wafers described above is not preferable in terms of market and economics. Therefore, in accordance with the concept "the larger serves for the smaller", an ion implantation apparatus is developed to comply with a diameter of a larger-diameter silicon semiconductor wafer, for example, 300 mm, and the ion implantation apparatus is allowed to be adapted to a non-silicon semiconductor wafer for a wide-gap semiconductor device, for example, a 100 mm-diameter semiconductor wafer.

Herein, the case where ion implantation is performed on a 100 mm-diameter semiconductor wafer by using a hybrid scanning single-wafer processing type ion implantation apparatus developed for a 300 mm-diameter semiconductor wafer is considered.

In this case, if a mechanism for retaining a 300 mm-diameter semiconductor wafer is provided, it is possible to relatively easily retain a 100 mm-diameter semiconductor wafer by using an appropriate semiconductor wafer holder. However, it is difficult to adapt the ion beam scanning and the semiconductor wafer scanning to the 100 mm-diameter semiconductor wafer. Hereinafter, the reasons are described.

In general, the ion implantation is required to be performed on the entire surface of the semiconductor wafer. Therefore, in the case of a 300 mm-diameter wafer, the ion beam needs to scan in a range exceeding a diameter of 300 mm, and the semiconductor wafer also needs to be mechanically scanned in the case of a 300 mm-diameter wafer. Needless to say, in the case of a 100 mm-diameter wafer, the ion beam needs to scan in a range exceeding a diameter of 100 mm, and the semiconductor wafer also needs to be mechanically scanned in the case of a 100 mm-diameter wafer.

However, in the case where an ion beam scans on an outer side of the semiconductor wafer, since the ion beam is not implanted into the semiconductor wafer, the ions become useless ions in terms of the ion implantation of the semiconductor wafer. The same description can be made even in the case where ions are implanted into an outer side of the semiconductor wafer in the direction by allowing the semiconductor wafer to be mechanically scanned. In addition, the above-described virtual planar ion implantation area may be considered, and it may be considered that, in the ion implantation area, an area in an outer side of the semiconductor wafer is useless.

Herein, in a hybrid scanning single-wafer processing type ion implantation apparatus developed for a typical 300 mm-diameter semiconductor wafer, since contrivance is not particularly made, an ion beam scanning method or a semiconductor wafer mechanical scanning method are determined in accordance to the case of the 300 mm-diameter wafer. Therefore, in the case of the 100 mm-diameter wafer, similarly, the ion beam scanning method or the semiconductor wafer mechanical scanning method is determined in accordance with the case of the 300 mm-diameter wafer. In a general case, the above-described scanning needs to be performed, and in this situation, as described later, it is important that, in a hybrid scanning single-wafer processing type ion implantation apparatus developed for a typical 300 mm-diameter semiconductor wafer, an ion scanning method or a semiconductor wafer mechanical scanning method is determined.

In this case, it is clear that, in accordance with the concept "the larger serves for the smaller", the ion beam scanning or the semiconductor wafer mechanical scanning is performed in accordance with a diameter of a larger-sized silicon semiconductor wafer, in this case 300 mm, so that the ion implantation can be performed on the entire surface of a 100 mm-diameter semiconductor wafer. In addition, it may be considered that, the area occupied by the 300 mm-diameter semiconductor wafer in the above-described virtual planar ion implantation area is larger than the area occupied by the 100 mm-diameter semiconductor wafer and the area occupied by the 300 mm-diameter semiconductor wafer is completely included in the area occupied by the 100 mm-diameter semiconductor wafer. It is clear that, in accordance with the concept "the larger serves for the smaller", in the above method in principle, although ions can be implanted into the entire surface of the 100 mm-diameter semiconductor wafer by using the hybrid scanning single-wafer processing type ion implantation apparatus developed for a 300 mm-diameter semiconductor wafer. However, the method cannot be employed in the semiconductor manufacturing process for mass production. Although the reason is described below, it may be said in brief that, since the efficiency of ion implantation is too low, the method is not suitable for practical use.

In other words, the case where the shape and area of the virtual planar ion implantation area set in the above-described ion implantation area space are the same, it is difficult to perform the ion implantation into the 100 mm-diameter semiconductor wafer for mass production by using the hybrid scanning single-wafer processing type ion implantation apparatus developed for a 300 mm-diameter semiconductor wafer in the semiconductor manufacturing process. Therefore, in order to perform the ion implantation into the 100 mm-diameter semiconductor wafer for mass production by using the hybrid scanning single-wafer processing type ion implantation apparatus developed for a 300 mm-diameter semiconductor wafer in the semiconductor manufacturing process, the shape and area of the virtual planar ion implantation area need to be further contrived.

In addition, although described below, for example, in the case of performing the ion implantation into the 100 mm-diameter semiconductor wafer by using the hybrid scanning single-wafer processing type ion implantation apparatus developed for a 300 mm-diameter semiconductor wafer, the area of the virtual planar ion implantation area needs to be allowed to be small so as to secure the efficiency of ion implantation suitable for practical use. In this case, the area of the virtual planar ion implantation area in the case of performing the ion implantation into the 100 mm-diameter semiconductor wafer needs to be allowed to be smaller than the area of a base material called a platen retaining the 300 mm-diameter semiconductor wafer. Therefore, during the ion implantation into the 100 mm-diameter semiconductor wafer, the ion beam does not appear in the outer side from the base material, and the ion beam current value cannot be measured during the ion implantation into the 100 mm-diameter semiconductor wafer.

The importance of the shape and area of the virtual planar ion implantation area set in the ion implantation area (space) is apparent not only in the case where the ion implantation is to be performed by using the same hybrid scanning single-wafer processing type ion implantation apparatus for the semiconductor wafers having greatly different diameters.

For example, in the case where the efficiency of ion implantation is to be improved, the importance of the shape and area of the virtual planar ion implantation area also becomes apparent. Hereinafter, the reason is described in brief.

In general, a silicon semiconductor wafer has a shape of a circle. Herein, in a typical hybrid scanning single-wafer processing type ion implantation apparatus, in the case where contrivance is not particularly made, the ion beam scanning and the semiconductor wafer mechanical scanning is independently performed. In this case, it can be easily understood that the shape of the virtual planar ion implantation area becomes a rectangle. Namely, although the rectangular-shaped virtual planar ion implantation area is formed in the circular semiconductor wafer, it is clear that a useless portion of the ion implantation area occurs in the vicinity of the four vertexes of the rectangle if there is not any other reason. In a typical hybrid scanning single-wafer processing type ion implantation apparatus, since ions are also implanted into this portion, there is still a room for improvement in terms of the efficiency of ion implantation.

As described later, some contrivance of allowing the shape of the virtual planar ion implantation area to be approximate to the shape of the semiconductor wafer in terms of the efficiency of ion implantation has been proposed. Needless to say, in this case, the efficiency of ion implantation is improved by the virtual planar ion implantation area having a smaller area. In other words, it is clear that, in the case where the ion implantation with good efficiency is performed by using the hybrid scanning single-wafer processing type ion implantation apparatus, the shape and area of the virtual planar ion implantation area are important.

Hereinbefore, the importance of the shape and area of the virtual planar ion implantation area set in the ion implantation area (space) is described by using the specific example. The importance does not only correspond to the above-described specific example, but the importance has generality. In other words, it can be easily estimated that there is a case where the shape and area of the virtual planar ion implantation area are importance for the other purposes. Particularly, it should be noted that, in the currently-used hybrid scanning single-wafer processing type ion implantation apparatus, the control of the shape and area of the virtual planar ion implantation area set in the ion implantation area space is greatly required due to engineering requirements and market and economic reasons. In addition, in the hybrid scanning single-wafer processing type ion implantation apparatus, the shape and area of the virtual planar ion implantation area may be one of the important factors.

In this consideration, preferably, in the hybrid scanning single-wafer processing type ion implantation apparatus, the control of the shape and area of the virtual planar ion implantation area set in the ion implantation area space may be considered in a unified manner in terms of technique irrespective of the purposes or the specific requirements. In other words, it is important that the control of the shape and area of the virtual planar ion implantation area are available in a range irrespective of the purposes.

In addition, there are also important factors with respect to the ion implantation itself. For example, a type of implanted ions, energy of implanted ions, an angle of ion implantation into a semiconductor wafer, a total amount of implanted ions (hereinafter, sometimes referred to as an "ion implantation dose"), and the like are particularly important factors. In addition, an amount of damage of implanted ions to a semiconductor wafer is an important factor in the ion implantation using the hybrid scanning single-wafer processing type ion implantation apparatus.

Particularly, by additionally remarking on the amount of damage of implanted ions to a semiconductor wafer, it is known that the amount of damage is changed according to temperature of the semiconductor wafer. Therefore, it is known that the amount of damage depends on the temperature of the base material called a platen retaining the semiconductor wafer and a period of the ion beam passing through a point of the semiconductor wafer, that is, a frequency of the beam scanning where the ion beam scans in one direction. Namely, it may said that, in the hybrid scanning single-wafer processing type ion implantation apparatus, the temperature of the base material called a platen retaining the semiconductor wafer and the frequency of the beam scanning where the ion beam scans in one direction are also important factors in the ion implantation.

Furthermore, it is important that the above-described important factors in the ion implantation are uniform over the surface of the semiconductor wafer. This is because, in the semiconductor manufacturing process, it is important to manufacture the semiconductor devices having the same performance over the entire surface of the semiconductor wafer, so that the important factors in the ion implantation need to be uniform over the surface of the semiconductor wafer. Particularly, it is important that the above-described ion implantation dose is uniform over the entire surface of the semiconductor wafer.

By summarizing the description hereinbefore, in the hybrid scanning single-wafer processing type ion implantation apparatus, the shape and area of the virtual planar ion implantation area are important factors, and as specific examples of important factors of the ion implantation itself, there are a type of ions, energy of ions, an angle of ion implantation, anion implantation dose, a temperature of a base material retaining the semiconductor wafer, and an ion beam scanning frequency. Particularly, the uniformity of the ion implantation dose over the surface of the semiconductor wafer is also an important factor. As described later in detail, in the hybrid scanning single-wafer processing type ion implantation apparatus, r contrivance of maintaining the uniformities of the ion beam scanning frequency and the ion implantation dose over the surface of the semiconductor wafer is particularly needed in the case where the ion implantation apparatus controls the shape and area of the virtual planar ion implantation area.

In addition, as described above, in the hybrid scanning single-wafer processing type ion implantation apparatus, it is preferable that the shape and area of the virtual planar ion implantation area can be controlled without necessarily measuring the ion beam current amount during the ion implantation.

Therefore, in the hybrid scanning single-wafer processing type ion implantation apparatus described hereinafter according to the embodiment, the shape and area of the virtual planar ion implantation area can be controlled without necessarily measuring the ion beam current value during the ion implantation while allowing the above-described important factors in the ion implantation to be maintained uniform over the surface of the semiconductor wafer.

Figure 1B:
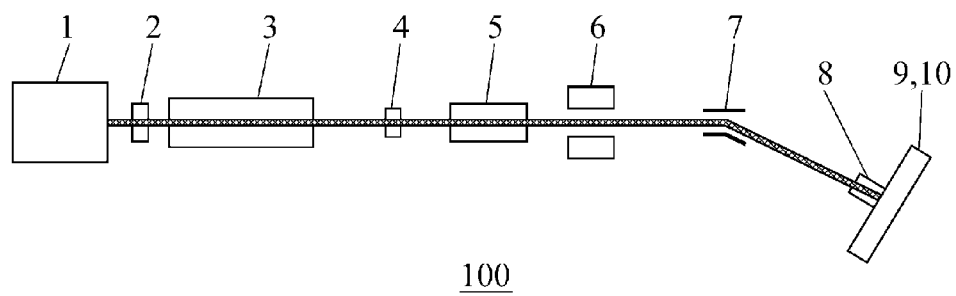
FIG. 1B is a schematic side diagram illustrating the configuration of the hybrid scanning single-wafer processing type ion implantation apparatus according to the embodiment.

FIG. 1A is a schematic plan diagram illustrating a configuration of a hybrid scanning single-wafer processing type ion implantation apparatus according to an embodiment, and FIG. 1B is a schematic side diagram illustrating the configuration of the hybrid scanning single-wafer processing type ion implantation apparatus according to the embodiment.

The hybrid scanning single-wafer processing type ion implantation apparatus (hereinafter, sometimes referred to as an "ion implantation apparatus" as appropriate) 100 according to the embodiment is configured so that an ion beam extracted from an ion source 1 by an extraction electrode 2 passes through a beamline reaching a semiconductor wafer 9. A mass analysis magnet device 3, a mass analysis slit 4, a beam scanner 5, and a wafer processing chamber (ion implantation chamber) are arranged along the beamline. A semiconductor wafer retainer 10 which retains the semiconductor wafer 9 is arranged in the wafer processing chamber. Since the semiconductor wafer 9 is very thin, the semiconductor wafer 9 and the semiconductor wafer retainer 10 are illustrated without distinguishment in FIGS. 1A and 1B. The ion beam extracted from the ion source 1 is guided along the beamline to the semiconductor wafer 9 on the semiconductor wafer retainer 10 arranged at an ion implantation position of the wafer processing chamber.

The ion beam reciprocally scans in one direction, that is, an X-scanning direction by using a beam scanner 5 and is paralleled due to a function of a parallel lens 6 to be guided to the semiconductor wafer 9. The beam scanner 5 illustrated in FIGS. 1A and 1B is an electric field type beam scanner 5, that is, a beam scanner which applies a periodically-varying electric field to make an ion beam scan in one direction in an ion implantation area space. This is an exemplary one, and thus, a magnetic field type beam scanner, that is, a beam scanner which applies a periodically-varying magnetic field to make an ion beam scan in one direction in an ion implantation area space may be used. In FIGS. 1A and 1B, in the case where no voltage is applied to the beam scanner 5, the ion beam does not scan; and in the case where positive and negative voltages are applied to the beam scanner 5, the ion beam reciprocally scans in the X-scanning direction. However, this is an exemplary one, and thus, various methods of applying voltage to the beam scanner 5 may be considered. For example, it may be considered that, in FIGS. 1A and 1B, a device exerting an electromagnetic force to the ion beam is arranged on the beamline between the ion source 1 and the beam scanner 5, so that the ion beam can be deflected downwards in FIG. 1A in the case where no voltage is applied to the beam scanner 5. In the embodiment, for simplifying the description, hereinafter, the example where the ion beam does not scan in the case where no voltage is applied to the beam scanner 5 and the ion beam reciprocally scans in the X-scanning direction in the case where positive and negative voltages are applied to the beam scanner 5 will be described.

In addition, as described above, the ion implantation apparatus according to the embodiment mechanically scans the semiconductor wafer 9 in the direction, that is, the Y-scanning direction perpendicular to the ion beam scanning direction, that is, the X-scanning direction to drive ions into the semiconductor wafer 9. In the ion implantation apparatus 100 illustrated in FIGS. 1A and 1B, the purity of the energy of ions is improved by bending the ion beam by using an angular energy filter 7. However, this is an example, and the angular energy filter 7 may not be used.

In the embodiment, the measurement of the ion beam is performed before the ion implantation into the semiconductor wafer 9. In the ion implantation apparatus 100 illustrated in FIGS. 1A and 1B, a beam measurement device 8 is used to measure the ion beam. FIGS. 1A and 1B illustrate the beam measurement device 8 which is movable to the position where the beam measurement device 8 geometrically interferes with the semiconductor wafer 9 during the ion implantation into the semiconductor wafer 9. Herein, although it is described in FIGS. 1A and 1B that the beam measurement device 8 is movable, this is an example, but a non-movable type beam measurement device 8 may be used. In addition, it is preferable that the shape and intensity of the ion beam at the position of the semiconductor wafer 9 are measured before the ion beam implantation and the shape and intensity of the ion beam are estimated during the ion implantation into an actual semiconductor wafer 9.

Therefore, it is preferable that the beam measurement device 8 is installed at the position where the beam measurement device 8 geometrically interferes with the semiconductor wafer 9 during the ion implantation into the semiconductor wafer 9. However, the beam measurement device 8 may also be installed at the position where the beam measurement device 8 does not interfere with the semiconductor wafer 9 during the ion implantation into the semiconductor wafer 9, that is, at a slight upstream side of the position of the semiconductor wafer 9 on the beamline or at a slight downstream side of the position of the semiconductor wafer 9 on the beamline. In addition, the shape and intensity of the ion beam may also be estimated during the ion implantation into an actual semiconductor wafer 9 by using a plurality of the beam measurement devices 8. In addition, in the description hereinafter mentioned, for simplifying the description, the description is made by using a movable type beam measurement device 8.

Figure 2:
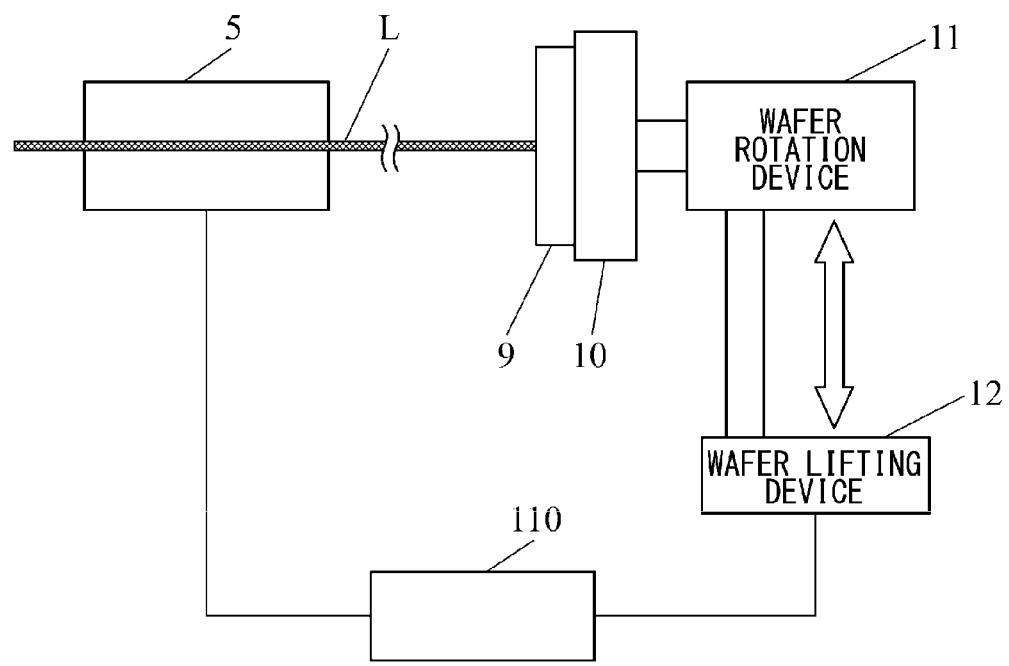
FIG. 2 is a schematic diagram illustrating surroundings of a semiconductor wafer in the ion implantation apparatus illustrated in FIGS. 1A and 1B in detail.

FIG. 2 is a schematic diagram illustrating surroundings of a semiconductor wafer 9 in the ion implantation apparatus 100 illustrated in FIGS. 1A and 1B in detail. As illustrated in FIG. 2, the surroundings of the semiconductor wafer 9 in the ion implantation apparatus 100 are configured to include a semiconductor wafer retainer 10, a wafer rotation device 11, a wafer lifting device 12, and the like, which are sometimes referred to as a mechanical scanning device 13 (refer to FIG. 3). In FIG. 2, the ion beam L scans in the direction perpendicular to the paper plane. In other words, in FIG. 2, the X-scanning direction is the direction perpendicular to the paper plane. In addition, in FIG. 2, the semiconductor wafer 9 retained on the semiconductor wafer retainer 10 is irradiated with the ion beam. The semiconductor wafer retainer 10 is reciprocally driven by the wafer lifting device 12 in the arrow direction in the figure. As a result, the semiconductor wafer 9 retained on the semiconductor wafer retainer 10 is reciprocally driven in the arrow direction in the figure. The ion implantation apparatus 100 implants ions into the semiconductor wafer 9 due to the operations.

Figure 3:
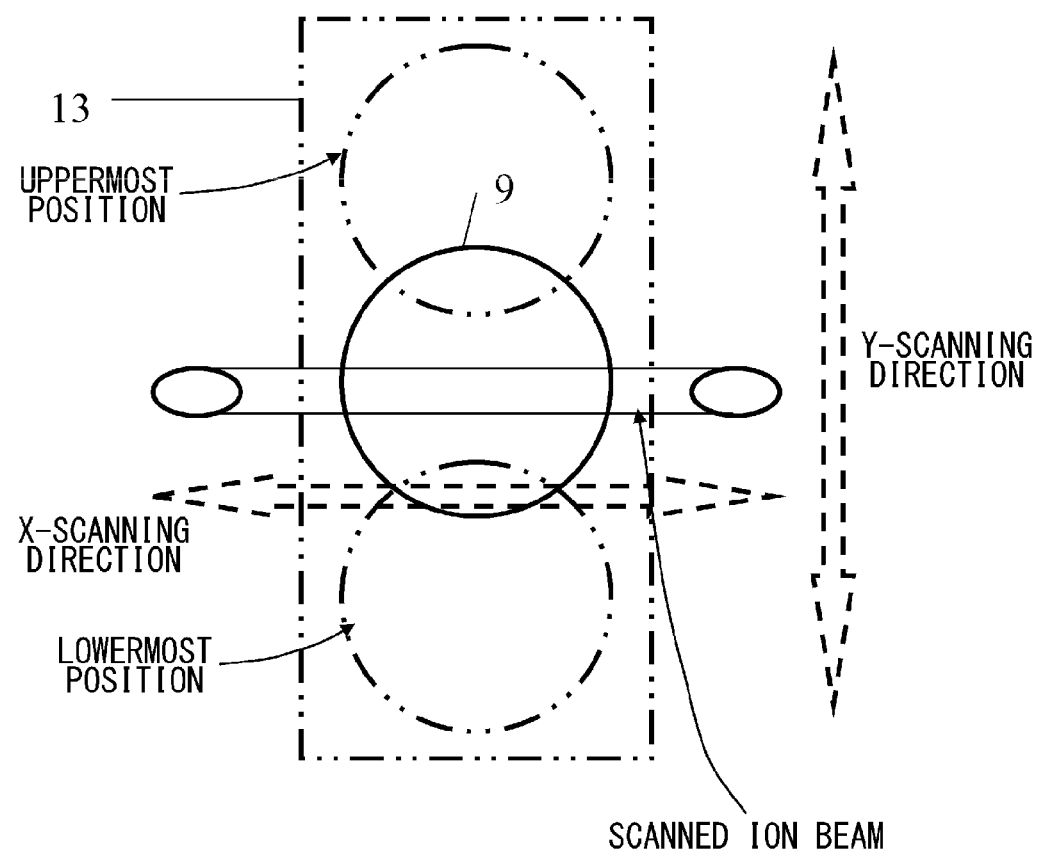
FIG. 3 is a diagram for explaining operations of the ion implantation apparatus.

Herein, the operations of the ion implantation apparatus 100 during the ion implantation into the semiconductor wafer 9 will be described more in detail with reference to FIG. 3. FIG. 3 is a diagram for explaining operations of the ion implantation apparatus 100. In FIG. 3, the ion beam scans in the transverse direction, and the semiconductor wafer 9 retained on the semiconductor wafer retainer 10 is scanned in the longitudinal direction. In FIG. 3, the uppermost and lowermost positions of the semiconductor wafer 9 are illustrated; the operating range of the mechanical scanning device 13 is illustrated; and the operations of the ion implantation apparatus 100 are explained. Herein, FIG. 3 illustrates the behavior where the ion beam scans by the beam scanner 5. In this manner, sometimes, the ion beam scanning in the X-scanning direction by the beam scanner 5 is referred to as a "scanning ion beam". Herein, although the behavior where the ion beam in a transversely extended shape scans and the semiconductor wafer 9 is irradiated with the ion beam in the scanned ion beam is illustrated in FIG. 3, this is an example. The ion beam irradiated by the beam scanner 5 may not be in a transversely extended shape as illustrated in FIG. 3, but the ion beam may be in a longitudinally extended shape or in a shape approximate to a circle.

Figure 4:
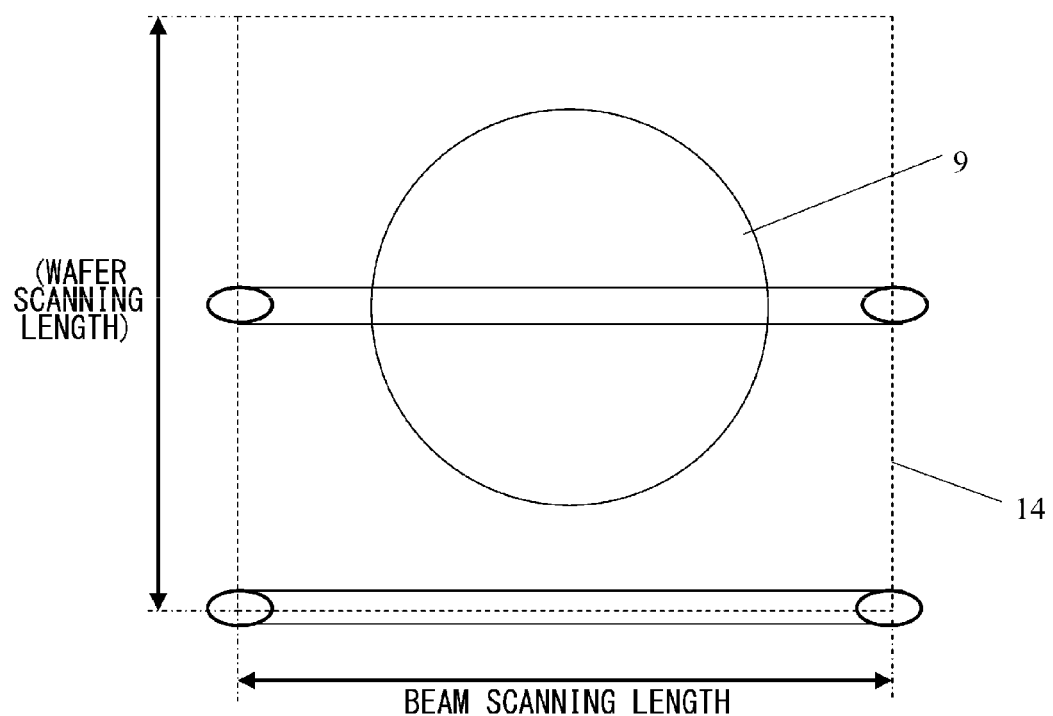
FIG. 4 is a diagram for explaining an ion implantation method in a hybrid scanning single-wafer processing type ion implantation apparatus.

Herein, an example of an ion implantation method performed in a hybrid scanning single-wafer processing type ion implantation apparatus will be described with reference to FIG. 4. FIG. 4 is a diagram for explaining the ion implantation method in the hybrid scanning single-wafer processing type ion implantation apparatus. In FIG. 4, the ion beam scanning direction is indicated by the transverse direction in the figure, and the range where the ion beam scans in the ion implantation area space is indicated by a "beam scanning length".

As illustrated in FIG. 3, the hybrid scanning single-wafer processing type ion implantation apparatus mechanically scans the semiconductor wafer 9 in the direction perpendicular to the beam scanning direction to drive ions into the semiconductor wafer 9. In FIG. 4, when the ion implantation into the semiconductor wafer 9 is to be considered, the relative motion between the ion beam and the semiconductor wafer 9 becomes a complicated problem. Therefore, for the convenience of understanding, under the assumption that the semiconductor wafer 9 is stopped, a virtual implantation area of the ion beam (hereinafter, referred to as a "virtual ion implantation area 14") may be considered. As described later in detail, the ion implantation apparatus is an apparatus of implanting ions into an object in an ion implantation area space, and the object is not limited to the semiconductor wafer 9, but it may be the semiconductor wafer retainer 10 or a device which retains the semiconductor wafer 9 through another device without a semiconductor wafer retaining mechanism in itself. Even in this case, for the convenience of understanding, under the assumption that the object and the like representatively expressed by the semiconductor wafer retainer 10 are stopped, and the virtual ion implantation area 14 may be considered. In summary, in the hybrid scanning single-wafer processing type ion implantation apparatus, the relative relationship between the implanted ions and the object relates to the case where the virtual ion implantation area 14 can be regarded as a virtual planar ion implantation area. Therefore, in the description hereinafter mentioned, under the assumption that the object and the like representatively expressed by the semiconductor wafer 9 and the semiconductor wafer retainer 10 are virtually stopped, the description will be made. In this case, in FIG. 4, the longitudinal direction length of the virtual ion implantation area 14 corresponds to the length of the wafer mechanical scan, and thus, the longitudinal direction length of the virtual ion implantation area 14 is referred to as a "wafer scanning length" hereinafter.

Herein, it should be noted that the center of gravity of the ion beam constituting the scanned ion beam reaches the entire virtual ion implantation area 14 and the boundary lines of the virtual ion implantation area 14 may be regarded as limit lines in the up-down and left-right directions which the center of the ion beam constituting the scanned ion beam reaches. In addition, in FIG. 4, the beam scanning length is constant irrespective of a position in a wafer mechanical scanning direction. When an ion implantation dose is to be maintained uniform over the entire surface of the semiconductor wafer 9 without changing a frequency of the beam scanning where the ion beam scans in one direction and without performing the measurement of the ion beam current value during the ion implantation, in the case where the ion implantation method or the ion implantation apparatus according to the embodiment is not used, the beam scanning length needs to be constant as illustrated in FIG. 4.

In FIG. 4, if the case of performing the ion implantation over the entire of the semiconductor wafer 9 is considered, at least the virtual ion implantation area 14 needs to completely include the semiconductor wafer 9. Therefore, as illustrated in FIG. 4, in the case where the virtual ion implantation area 14 has a rectangular shape, the beam scanning length and the wafer scanning length need to be larger than the diameter of the semiconductor wafer 9 in order to implant ions on the entire surface of the semiconductor wafer 9. In addition, although it is clear that ions can be implanted into the entire surface of the semiconductor wafer 9 only under the condition of both of the scanning lengths, it is not secured that the ion implantation dose implanted into the semiconductor wafer 9 by the hybrid scanning single-wafer processing type ion implantation apparatus only under the condition is uniform over the entire surface of the semiconductor wafer 9. In other words, in the virtual ion implantation area 14, so as to allow an ion implantation dose per unit time and unit area implanted into the semiconductor wafer 9 to be maintained constant, uniformity of beam-scan-direction ion implantation dose and uniformity of wafer-scan-direction ion implantation dose need to be secured.

In the ion implantation apparatus 100 according to the embodiment, the ion beam is measured by using the beam measurement device 8 before the ion implantation as needed, and furthermore, fine adjustment of the periodically-varying electric or magnetic field applied to the beam scanner 5 is performed as needed, so that the uniformity of X-scan-direction ion implantation dose can be secured. With respect to the uniformity of Y-scan-direction ion implantation dose, in the case where a change in beam does not occur, the semiconductor wafer 9 is scanned at a constant speed by using the mechanical scanning device 13, so that the uniformity of Y-scan-direction ion implantation dose can be secured. By securing these uniformities of two-dimensional ion implantation doses, an ion implantation dose per unit time and unit area implanted into the semiconductor wafer 9 is maintained constant.

Figure 5:
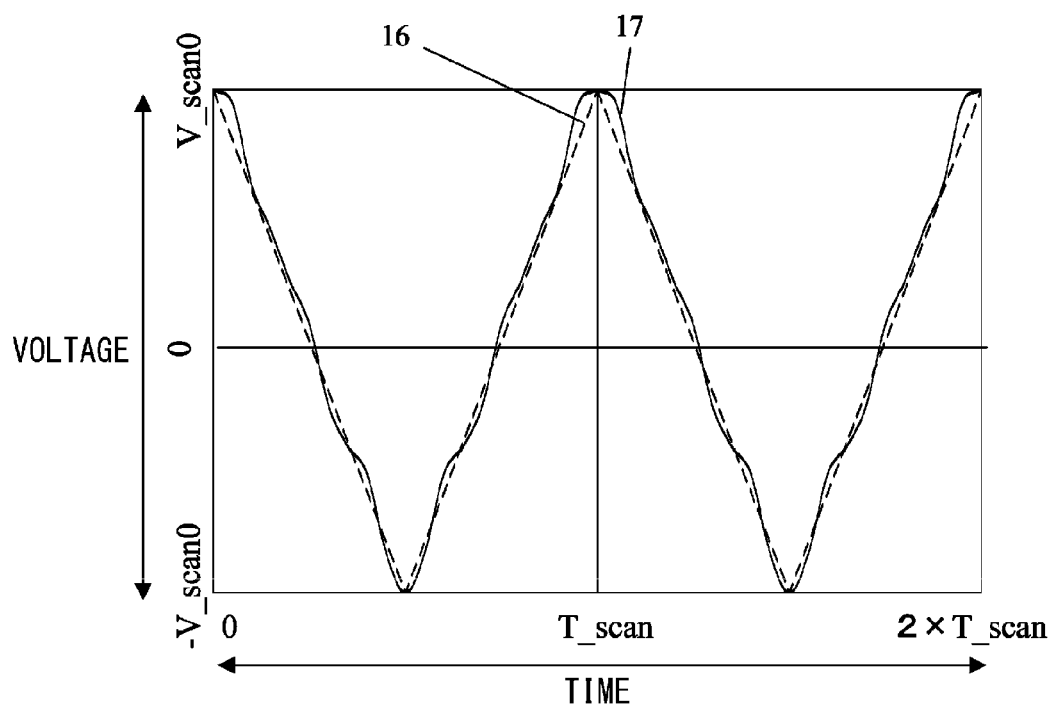
FIG. 5 is a diagram illustrating an example of a periodically-varying electric field applied to a beam scanner.

Herein, fine adjustment of a periodically-varying electric field or a periodically-varying magnetic field applied to the beam scanner 5, which is performed so as to secure uniformity of X-scan-direction ion implantation dose, will be described with reference to FIG. 5. FIG. 5 is a diagram illustrating an example of a periodically-varying electric field applied to the beam scanner 5. Although the electric field type beam scanner 5 illustrated in FIGS. 1A and 1B is described in detail with reference to FIG. 5, this is an example, and the description with reference to FIG. 5 is almost directly adapted to the magnetic field type beam scanner 5 by replacing the electric field with the magnetic field in reading. In addition, in the embodiment, for simplifying the description, the case where the ion beam does not scan in the case of applying no voltage to the beam scanner 5 and ion beam reciprocally scans in the X-scanning direction by applying positive and negative voltage to the beam scanner 5 will be described with reference to FIG. 5.

As described with reference to FIGS. 1A and 1B, the electric field type beam scanner 5 is a device which applies a periodically-varying electric field to ions during the transportation of the ion beam in the beamline indicated by, for example, FIGS. 1A and 1B in order to allow the ion beam to scan in one direction in the ion implantation area space. Herein, if the periodically-varying electric field is configured as a function of time where a simple triangular shape is periodically repeated as indicated by the dotted line in FIG. 5 (hereinafter, sometimes referred to as a triangular electric field 16), the uniformity of X-scan-direction ion implantation dose cannot be secured in the hybrid scanning single-wafer processing type ion implantation apparatus currently used for mass production of the semiconductor device. Therefore, in the hybrid scanning single-wafer processing type ion implantation apparatus currently used for mass production of the semiconductor device, in order to secure the uniformity of X-scan-direction ion implantation dose, generally, the modified periodically-varying electric field is applied to the electric field type beam scanner 5 as indicated by the solid line in FIG. 5 by using spatial position dependency of the measured beam current value of the ion beam before the ion implantation into the semiconductor wafer 9. Herein, the periodically-varying electric field is an electric field obtained by setting the triangular electric field 16 as a function of time, that is, a periodically-repeating triangular shape as a reference, and adding perturbation besides the triangular shape to the periodically-varying electric field. Hereinafter, sometimes, the electric field illustrated by the solid line of FIG. 5 is referred to as a perturbation-added electric field 17. Accordingly, an ion implantation dose per unit time and unit area implanted into the semiconductor wafer 9 is maintained constant.

In addition, it may be understood that the "spatial position dependency" is a difference according to, for example, the site of the measured beam current value of the ion beam (position in the scanning direction). The spatial position dependency is calculated by continuously (without stoppage of the beam measurement device) measuring the beam current value according to the site by using, for example, a movable Faraday-cup-type beam measurement device. Although there may be various specific calculation methods, there is no particular limitation. For example, the ion beam scanning is initially performed based on originally-set initial parameters, the initial parameters are corrected based on the measured beam current value measured by the beam measurement device, and the ion beam scanning is performed again. Next, the perturbation-added electric field 17 may be calculated by repeating these processes until a difference between the spatial position dependency of measured beam current value and an ideal spatial position dependency of measured beam current value is equal to or less than an allowable value.

Therefore, for example, in FIG. 5, the perturbation-added electric field 17 illustrated by the solid line of FIG. 5 is selected as the electric field applied to the electric field type beam scanner 5. Herein, in FIG. 5, the minimum value of the perturbation-added electric field 17 is −V_scan (V), and the maximum value of the perturbation-added electric field 17 is V_scan (V). In the ion implantation into the semiconductor wafer 9, since the left-right symmetric virtual ion implantation area 14 is generally selected in the X-scanning direction, in a general case, the maximum and minimum values of the electric field applied to the electric field type beam scanner 5 have the same absolute value. Needless to say, even in the case where the maximum and minimum values of the electric field applied to the electric field type beam scanner 5 have different absolute values, the description made with reference to FIG. 5 is valid.

Herein, the time period where the perturbation is added to the periodically-varying electric field is described. If the electric field repetition period is denoted by T_scan (sec), in general, the period where the perturbation is added to the electric field is expressed by T_scan/N (sec). Herein, N is an integer. In the hybrid scanning single-wafer processing type ion implantation apparatus currently used for mass production of the semiconductor device, in the case where the perturbation-added electric field as the periodically-varying electric field is applied to the electric field type beam scanner 5 in order to secure the uniformity of X-scan-direction ion implantation dose, if the effect and controllability are compared and considered, the value of N is an integer from 16 to 16384, preferably, from 64 to 512. For example, if the case where period of the periodically-repeating electric field as a function of time applied to the electric field type beam scanner 5 obtained by setting the triangular shape as reference, that is, the ion beam scanning period is 4 msec is taken, the period where the perturbation is added to the electric field is in a range from 0.25 msec to 0.24 μsec, preferably, in a range from 0.063 msec to 7.8 μsec.

Herein, the electric field applied to the electric field type beam scanner 5 and the position of the ion beam in the X-scanning direction will be described. As can be seen from FIGS. 1A and 1B, there is a correlation between the electric field applied to the electric field type beam scanner 5 and the position of the ion beam in the X-scanning direction. More specifically, in the case where the ion beam does not scan in the case of applying no voltage to the beam scanner 5 and the ion beam is reciprocally scanned in the X-scanning direction by applying positive and negative voltages to the beam scanner 5 as exemplified in FIG. 5, for example, in FIG. 1A, when the ion beam is moved downward by applying the positive voltage to the beam scanner 5, the position of the ion beam in the X-scanning direction is shifted downward as the positive voltage applied to the beam scanner 5 is increased; and on the contrary, the position of the ion beam in the X-scanning direction is shifted upward as the negative voltage applied to the beam scanner 5 is increased. Whether the correlation is to be a proportional relationship, a quadratic functional relationship, or a correlation based on a more complicated function depends on the shape of the beam scanner 5. However, in any case, it is clear that there is a monotonic functional relation in terms of mathematics. Therefore, the voltage applied to the beam scanner 5 and the position of the ion beam in the X-scanning direction have a correspondence to each other determined according to the shape of the beam scanner 5. Accordingly, the voltage intensity applied to the electric field type beam scanner 5 and the position of the ion beam in the X-scanning direction are controlled by using the correspondence, so that the beam scanning length of the virtual ion implantation area 14 can be controlled, for example, as illustrated in FIG. 4.

In addition, needless to say, in FIG. 1A, even in the case where the ion beam is moved upward by applying a positive voltage to the beam scanner 5, or in the case where the mechanism of applying an electromagnetic force to the ion beam is installed on the beamline between the ion source 1 and the beam scanner 5 so that the ion beam can be scanned in the case of applying no voltage to the beam scanner 5, the voltage applied to the beam scanner 5 and the position of the ion beam in the X-scanning direction have a correspondence to each other determined according to the shape of the beam scanner 5.

Herein, problems of the case of implanting ions into a semiconductor wafer (hereinafter, referred to as a "small-sized semiconductor wafer 15") which is smaller than the semiconductor wafer 9 originally corresponding to the hybrid scanning single-wafer processing type ion implantation apparatus, for example, the case of performing ion implantation into a 100 mm-diameter semiconductor wafer by using a hybrid scanning single-wafer processing type ion implantation apparatus developed for a 300 mm-diameter semiconductor wafer will be described with reference to FIG. 6.

First, in the hybrid scanning single-wafer processing type ion implantation apparatus, a method of installing a small-sized semiconductor wafer 15, which is smaller than the semiconductor wafer 9 as an original object of the ion implantation apparatus, on the beamline in the wafer processing chamber will be described. FIG. 6 is a diagram illustrating a case where the semiconductor wafer retainer 10 is reconstructed so as to be used for the small-sized semiconductor wafer 15. However, the method of installing the small-sized semiconductor wafer 15 on the beamline in the wafer processing chamber is not limited thereto. For example, a transformation adaptor may be installed between the semiconductor wafer retainer 10 and the small-sized semiconductor wafer 15; the small-sized semiconductor wafer 15 may be attached to the semiconductor wafer retainer 10 by using an adhesive tape; and the small-sized semiconductor wafer 15 may be attached to the semiconductor wafer 9 by using an adhesive tape and the semiconductor wafer 9 may be retained in the semiconductor wafer retainer 10.

Figure 6:
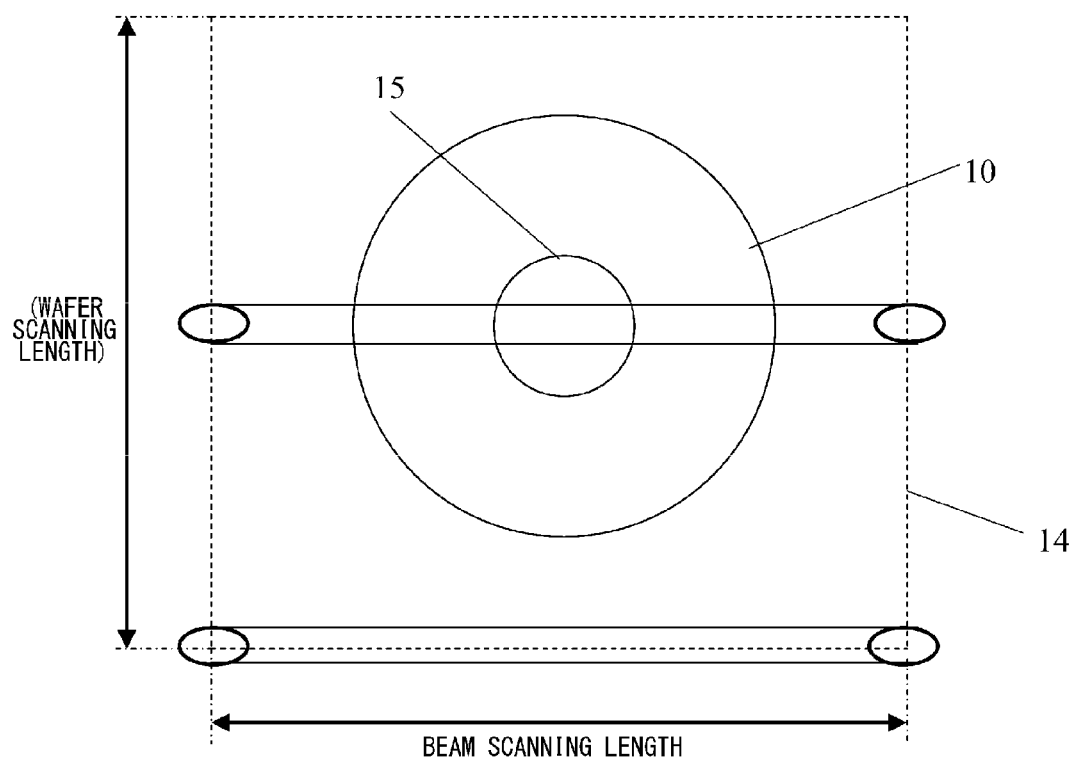
FIG. 6 is a diagram illustrating a case where a semiconductor wafer retainer is reconstructed so as to be used for a small-sized semiconductor wafer.

Herein, in FIG. 6, if the case of performing the ion implantation on the entire surface of the small-sized semiconductor wafer 15 is considered, it is necessary that the virtual ion implantation area 14 completely includes the small-sized semiconductor wafer 15. However, as can be seen from FIG. 6, it is clear that the rectangular-shaped virtual ion implantation area 14 illustrated in FIG. 6 is too larger than the area of the small-sized semiconductor wafer 15. The reason is that the hybrid scanning single-wafer processing type ion implantation apparatus considered herein corresponds to the semiconductor wafer 9 which is larger than the small-sized semiconductor wafer 15. Therefore, this is because, the semiconductor wafer retainer 10 is also larger than the small-sized semiconductor wafer 15; as long as the rectangular-shaped virtual ion implantation area 14 is considered, the size corresponding to the semiconductor wafer 9 cannot be obtained; and as a result, the rectangular-shaped virtual ion implantation area 14 is larger than the area of the small-sized semiconductor wafer 15. With respect to the virtual ion implantation area 14 in the outer side of the small-sized semiconductor wafer 15, the outer side of the small-sized semiconductor wafer 15 is scanned with the ion beam, or the small-sized semiconductor wafer 15 together with the semiconductor wafer retainer 10 is mechanically scanned. As a result, the above case is the same as the case where the outer side of the small-sized semiconductor wafer 15 is scanned with the ions in the mechanical scanning direction, and in this case, the ion beam scanned on the outer side of the small-sized semiconductor wafer 15 are not implanted into the small-sized semiconductor wafer 15. Therefore, in terms of the ion implantation into the small-sized semiconductor wafer 15, the ion beam scanned on the outer side of the small-sized semiconductor wafer 15 becomes useless ions.

Herein, although the case where ions are implanted into the small-sized semiconductor wafer 15 which is smaller than the semiconductor wafer 9 corresponding to the hybrid scanning single-wafer processing type ion implantation apparatus by using the hybrid scanning single-wafer processing type ion implantation apparatus is considered in FIG. 6, herein, only the ion implantation method such as the ion implantation into the semiconductor wafer 9 is used, and contrivance is not particularly made. In other words, since the ion beam scanning method or the mechanical scanning method for the semiconductor wafer retainer 10 in accordance with the semiconductor wafer 9 corresponding to the hybrid scanning single-wafer processing type ion implantation apparatus is used, contrivance is not particularly made.

In this case, it is clear that, by employing the implantation technique of the hybrid scanning single-wafer processing type ion implantation apparatus with respect to the semiconductor wafer 9, the implantation can be performed on the small-sized semiconductor wafer 15 so that the ion implantation dose per unit time and unit area implanted on the entire surface of the small-sized semiconductor wafer 15 is maintained constant. In other words, in accordance with the concept "the larger serves for the smaller", in the above method in principle, if ions are implanted into the small-sized semiconductor wafer 15 by using the rectangular-shaped virtual ion implantation area 14 coping with the semiconductor wafer 9, for example, as illustrated in FIG. 5, the ions can be implanted so that the ion implantation dose per unit time and unit area implanted on the entire surface of the small-sized semiconductor wafer 15 is maintained constant.

However, the efficiency of ion implantation is too low, and it is not suitable for practical use of the semiconductor manufacturing process for mass production. Although the low efficiency of ion implantation can be clearly seen from FIG. 6, the description thereof will be made more in detail hereinafter. Herein, for example, a 300 mm-diameter semiconductor wafer as the semiconductor wafer 9 is considered; in a hybrid scanning single-wafer processing type ion implantation apparatus developed for the 300 mm-diameter semiconductor wafer, a 100 mm-diameter semiconductor wafer as the small-sized semiconductor wafer 15 is considered; and ion implantation into the 100 mm-diameter semiconductor wafer using the hybrid scanning single-wafer processing type ion implantation apparatus is considered. Herein, the area of the 100 mm-diameter semiconductor wafer is 1/9 times the area of the 300 mm-diameter semiconductor wafer. Herein, in the hybrid scanning single-wafer processing type ion implantation apparatus developed for a 300 mm-diameter semiconductor wafer, since the area of the rectangular-shaped virtual ion implantation area 14 is configured to larger than at least the area of the 300 mm-diameter semiconductor wafer, the area of the rectangular-shaped virtual ion implantation area 14 is nine or more times, typically, ten or more times the area of the 100 mm-diameter semiconductor wafer. In addition, since a general virtual ion implantation area 14 has a rectangular shape and the semiconductor wafer has a circular shape, the area of the virtual ion implantation area 14 is further increased in comparison with the area of the 100 mm-diameter semiconductor wafer. In addition, the boundary lines of the virtual ion implantation area 14 may be regarded as the limit lines in the up-down and left-right directions, where the center of the ion beam constituting the scanned ion beam reaches. Since an actual ion beam has a finite width as illustrated in FIG. 4, the area of the virtual ion implantation area 14 is further increased in comparison with the area of the 100 mm-diameter semiconductor wafer. In this manner, in the case where ions are implanted in the small-sized semiconductor wafer 15 which is smaller than the semiconductor wafer 9 corresponding to the hybrid scanning single-wafer processing type ion implantation apparatus without particular contrivance, the area of the virtual ion implantation area 14 is much larger than the area of the small-sized semiconductor wafer 15, the efficiency of ion implantation is too low, and it is not suitable for practical use of the semiconductor manufacturing process for mass production.

Therefore, in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production, the shape and area of the virtual ion implantation area 14 need to be changed in accordance with the shape of the small-sized semiconductor wafer 15.

Figure 7:
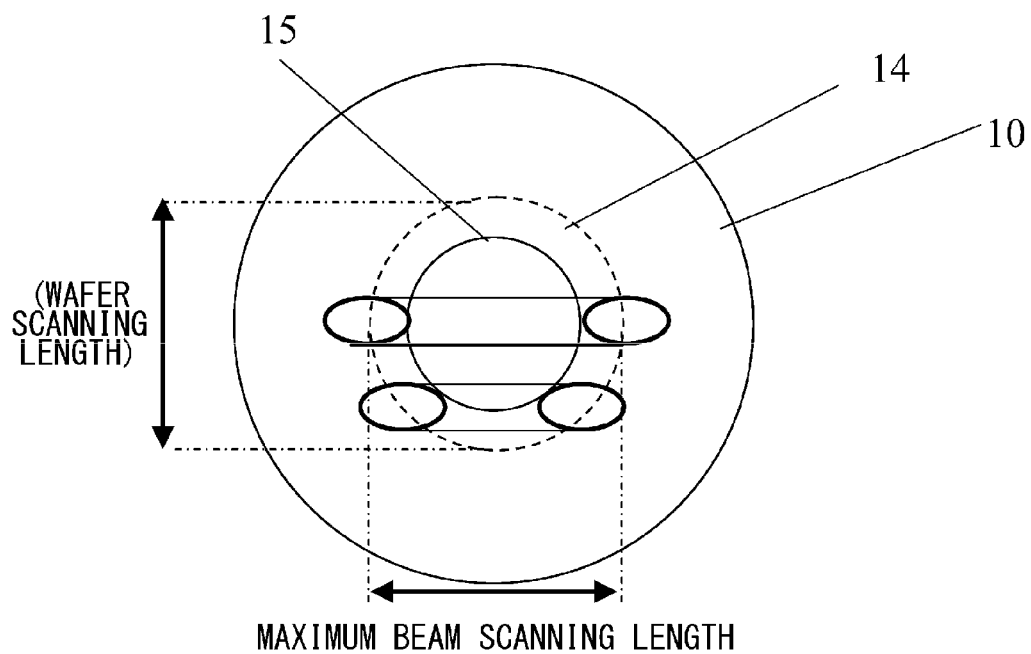
FIG. 7 is a diagram for explaining a shape of a virtual ion implantation area according to the embodiment.

Herein, the virtual ion implantation area 14 according to the embodiment will be described with reference to FIG. 7. FIG. 7 is a diagram for explaining a shape of the virtual ion implantation area 14 according to the embodiment. In the embodiment, the shape and area of the virtual ion implantation area 14 is allowed to be changed in accordance with the shape of the small-sized semiconductor wafer 15 in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production. In the case of using a single small-sized semiconductor wafer 15 as illustrated in FIG. 7, for example, the virtual ion implantation area 14 illustrated in FIG. 7 may be considered to be appropriate. Namely, as the shape of the virtual ion implantation area 14, a shape approximate to the shape of the small-sized semiconductor wafer 15, that is, a shape approximate to a polygonal shape having more vertexes than a regular icosagon or a circle is considered to be appropriate. In addition, as the area of the virtual ion implantation area 14, an area which is larger than the area of the small-sized semiconductor wafer 15 but several times the area of the small-sized semiconductor wafer 15 is considered to be appropriate. Herein, it should be noted that, as seen from FIG. 7, in the case where non-rectangular shape is selected as the shape of the virtual ion implantation area 14 in accordance with the shape of the small-sized semiconductor wafer 15, the beam scanning length is not uniquely determined, but at least a plurality of the beam scanning lengths are needed. Although the maximum beam scanning length is clearly seen in FIG. 6, in the example of FIG. 7, the portion where the beam scanning length is the maximum beam scanning length is only the central portion of the small-sized semiconductor wafer 15, and in the other portions, the beam scanning length is equal to or smaller than the maximum beam scanning length.

In addition, although the virtual ion implantation area 14 completely includes the small-sized semiconductor wafer 15 in the example of FIG. 7, the virtual ion implantation area 14 is completely included in the semiconductor wafer retainer 10 in the relationship between the virtual ion implantation area 14 and the semiconductor wafer retainer 10. In addition, it may be expressed that the planar area shaped by the semiconductor wafer retainer 10 includes the virtual ion implantation area 14, that is, the virtual planar ion implantation area (hereinafter, sometimes the "virtual planar ion implantation area" is referred to as a "virtual ion implantation area 14" as appropriate). In this case, ions do not appear in the outer side of the semiconductor wafer retainer 10 during the ion implantation into the small-sized semiconductor wafer 15. In this case, since the measurement of the ion beam current value is impossible during the ion implantation, when the virtual ion implantation area 14 is to be generated, if an ion implantation method where the measurement of the ion beam current value is unnecessary is not used, the shape and area of the virtual ion implantation area 14 cannot be changed in accordance with the shape of the small-sized semiconductor wafer 15 as illustrated in FIG. 7. Therefore, in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production, an ion implantation method where the measurement of the ion beam current value is not necessary during the ion implantation needs to be used so as to change the shape and area of the virtual ion implantation area 14 in accordance with the shape of the small-sized semiconductor wafer 15.

As described above, in the hybrid scanning single-wafer processing type ion implantation apparatus, the method of installing the small-sized semiconductor wafer 15, which is smaller than the semiconductor wafer 9 as an original object of the ion implantation apparatus, on the beam line in the wafer processing chamber is not limited to the case where the semiconductor wafer retainer 10 is reconstructed so as to be used for the small-sized semiconductor wafer 15 as illustrated in FIG. 6 or 7. For example, a transformation adaptor may be installed between the semiconductor wafer retainer 10 and the small-sized semiconductor wafer 15; the small-sized semiconductor wafer 15 may be attached to the semiconductor wafer retainer 10 by using an adhesive tape; and the small-sized semiconductor wafer 15 may be attached to the semiconductor wafer 9 with an adhesive tape and the semiconductor wafer 9 may be retained in the semiconductor wafer retainer 10. Therefore, the semiconductor wafer retainer 10 exemplified in FIG. 7 may be the semiconductor wafer 9. In this case, in a situation similar to that of FIG. 7, the virtual ion implantation area 14 is completely included in the semiconductor wafer 9. In addition, in the case of implanting ions into the semiconductor wafer 9, it may be expressed that the planar area shaped by the semiconductor wafer 9 includes the virtual ion implantation area 14. In this case, it may be said that ions do not appear in the outer side of the semiconductor wafer 9 during the ion implantation into the small-sized semiconductor wafer 15 and the ion beam continue to be implanted into the semiconductor wafer 9 from the implantation start time to the implantation end time.

Herein, it is important that, irrespective of changing the shape and area of the virtual ion implantation area 14, the ion implantation needs to be performed so that the ion implantation dose per unit time and unit area implanted on the entire surface of the small-sized semiconductor wafer 15 is maintained constant, that is, the ion implantation dose is uniform over the entire surface of the small-sized semiconductor wafer 15.

As described above with reference to FIG. 5, in the case where the virtual ion implantation area 14 has a rectangular shape, in the hybrid scanning single-wafer processing type ion implantation apparatus currently used for mass production of the semiconductor device, in order to secure the uniformity of X-scan-direction ion implantation dose, in general, the electric field generated by adding the perturbation to the periodically-varying electric field is applied to the electric field type beam scanner 5. Accordingly, an ion implantation dose per unit time and unit area implanted into the semiconductor wafer 9 is maintained constant. This situation is not changed at the time of the ion implantation into the small-sized semiconductor wafer 15. Therefore, in the case where the virtual ion implantation area 14 has a rectangular shape, the ion implantation dose to be implanted per unit time and unit area into the small-sized semiconductor wafer 15 can be maintained constant by using the same method as that of FIG. 5. However, in the case where the shape of the virtual ion implantation area 14 is a non-rectangular shape, some contrivance is needed so as to allow the ion implantation dose to be implanted per unit time and unit area into the small-sized semiconductor wafer 15 to be maintained constant.

In addition, it is important that, irrespective of changing the shape and area of the virtual ion implantation area 14, it is difficult to change the frequency of the scanning where the ion beam is scanned in one direction, namely, it is difficult to change the electric field repetition period.

Figure 8:
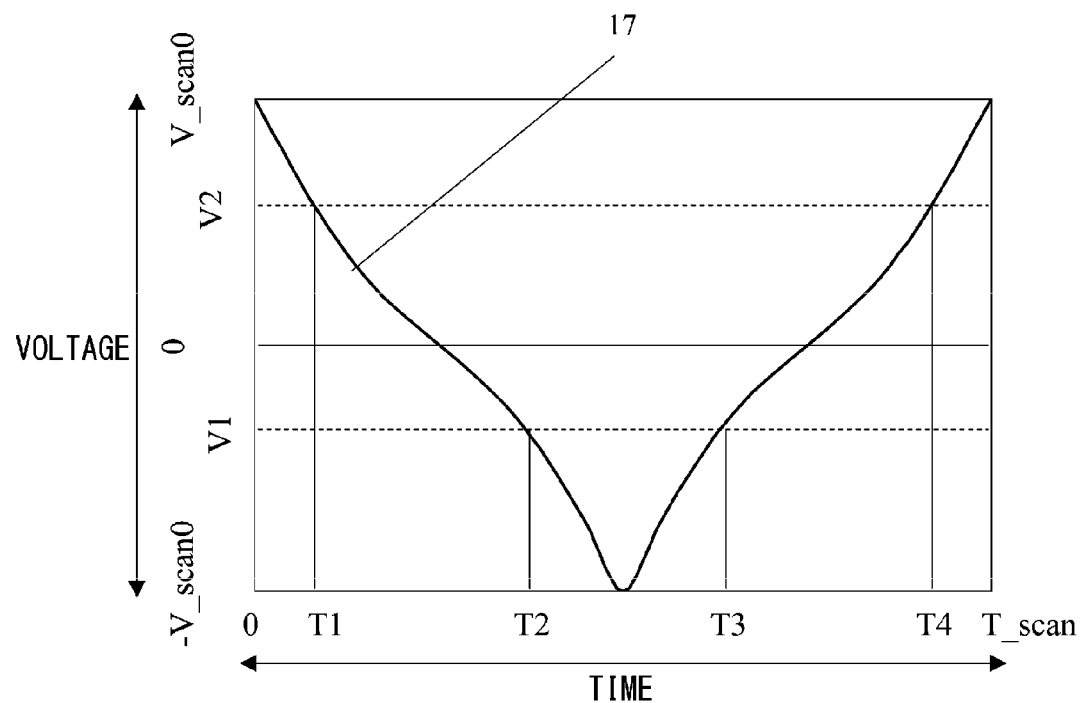
FIG. 8 is a diagram illustrating one period of the periodically-varying electric field which is to be applied to an electric field type beam scanner.

Herein, an example of a method of changing a beam scanning length corresponding to a plurality of beam scanning lengths will be described with reference to FIG. 8. FIG. 8 is a diagram illustrating one period of the periodically-varying electric field which is to be applied to the electric field type beam scanner 5. As described above, in the hybrid scanning single-wafer processing type ion implantation apparatus currently used for mass production of the semiconductor device, the perturbation-added electric field is applied to the electric field type beam scanner 5, and the electric field added with the perturbation-added electric field 17 is indicated by the solid line of FIG. 8.

Herein, in order to set a plurality of the beam scanning lengths, in the case where the voltage applied to the beam scanner 5 in FIG. 8 has a maximum value V_scan0 (V) and a minimum value −V_scan0 (V), a method of setting the beam scanning length which is smaller than the maximum beam scanning length of the virtual ion implantation area 14 is considered. As described above with reference to FIG. 5, the voltage intensity applied to the beam scanner 5 and the position of the ion beam in the X-scanning direction are controlled by using the correspondence between the voltage applied to the beam scanner 5 and the position of the ion beam in the X-scanning direction determined according to the shape of the beam scanner 5, so that the beam scanning length of the virtual ion implantation area 14 can be controlled.

For example, in FIG. 8, when a maximum value V2 (V) and a minimum value V1 (V) are applied as voltages applied to the beam scanner 5 so that the beam scanning length which is smaller than the maximum beam scanning length of the virtual ion implantation area 14 can be implemented, the positions of the ion beam at the two ends of the beam scanning length which is shorter than the maximum beam scanning length can be controlled based on the correspondence between the voltage applied to the beam scanner 5 and the position of the ion beam in the X-scanning direction determined according to the beam scanner 5. In this case, in FIG. 8, the voltage applied to the beam scanner 5 becomes the maximum value V2 (V) at the time point T1; the voltage applied to the beam scanner 5 becomes the minimum value V1 (V) at the time point T2; the voltage applied to the beam scanner 5 becomes the minimum value V1 (V) at the time point T3; and the voltage applied to the beam scanner 5 becomes the maximum value V2 (V) at the time point T4.

Figure 9:
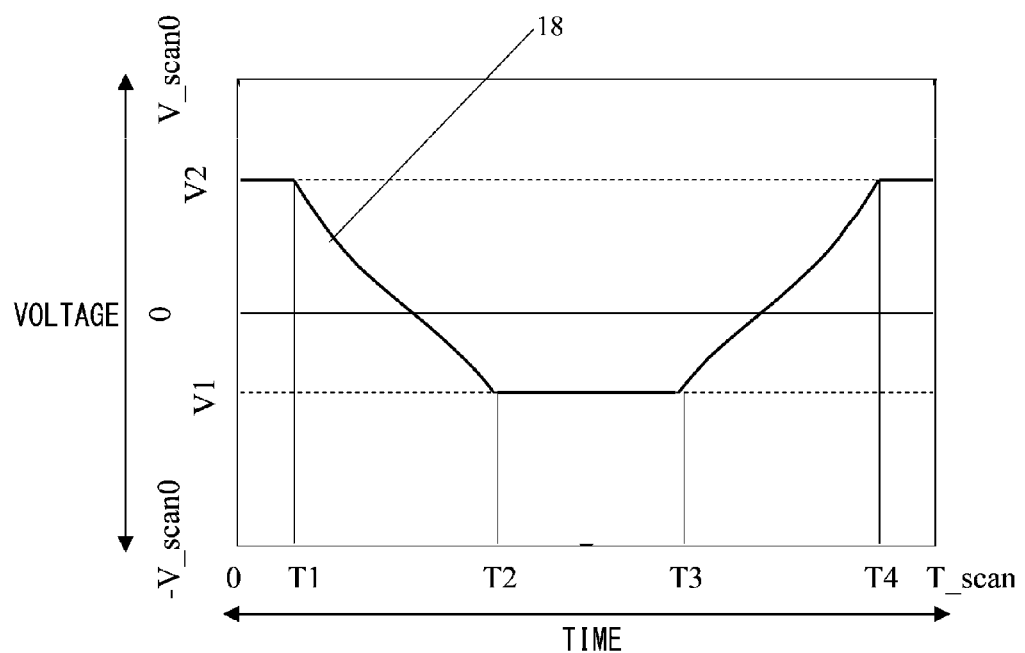
FIG. 9 is a diagram illustrating an example of a relationship between an electric field which is to be applied to a beam scanner and time.

Herein, an example of implementing a beam scanning length, which is smaller than the maximum beam scanning length of the virtual ion implantation area 14 will be described with reference to FIG. 9. FIG. 9 is a diagram illustrating an example of a relationship between an electric field which is to be applied to a beam scanner and time. As described above, for example, in the case of FIG. 8, the positions of the ion beam at the two ends of the beam scanning length which is shorter than the maximum beam scanning length can be expressed by using the maximum value V2 (V) and the minimum value V1 (V) as the voltages applied to the beam scanner 5. Therefore, in order to implement the beam scanning length which is smaller than the maximum beam scanning length, neither a voltage of V2 (V) or more nor a voltage of V1 (V) or less is allowable as the voltage applied to the beam scanner 5. Accordingly, in order to implement the beam scanning length which is smaller than the maximum beam scanning length of the virtual ion implantation area 14, a method of applying a time-varying voltage to the beam scanner 5, for example, as illustrated in FIG. 9 is considered. Since the shape of the electric field indicated by the solid line FIG. 9 is too different from the shape of the triangular electric field 16, it may not be said that an electric field obtained by setting the triangular electric field 16 as a function of time, that is, the periodically-repeating triangular shape as a reference, and adding perturbation besides the triangular shape to the periodically-varying electric field is applied to the electric field type beam scanner 5. Therefore, although the electric field is not the perturbation-added electric field 17, since it may be considered that very large correction is performed on the triangular electric field 16, the electric field may be treated as a pseudo-perturbation-added electric field 18.

The pseudo-perturbation-added electric field 18 illustrated in FIG. 9 is described in brief. The pseudo-perturbation-added electric field 18 is a voltage applied to the beam scanner 5 which has a constant value as the maximum value V2 (V) from the time point 0 to the time point T1, the perturbation-added electric field 17 obtained for the maximum beam scanning length of the virtual ion implantation area 14 illustrated in FIG. 8 from the time point T1 to the time point T2, a constant value as the minimum value V1 (V) from the time point T2 to the time point T3, the perturbation-added electric field 17 obtained for the maximum beam scanning length of the virtual ion implantation area 14 illustrated in FIG. 8 from the time point T3 to the time point T4, and a constant value of the maximum value V2 (V) from the time point T4.

In this case, it is clear that, since the voltage applied to the beam scanner 5 is in a range from the maximum value V2 (V) to the minimum value V1 (V) and the electric field repetition period is T_scan (sec), the ion beam scanning frequency is not changed. However, in the pseudo-perturbation-added electric field 18 illustrated in FIG. 9, the voltage applied to the beam scanner 5 has a predetermined value of the minimum value V1 (V), for example, from the time point T2 to the time point T3. Therefore, the ion beam is not scanned in the X-scanning direction, but it is stopped at the position, then the efficiency of ion implantation is not improved.

In other words, it is clear that, in the pseudo-perturbation-added electric field 18 illustrated in FIG. 9, the beam scanning length which is smaller than the maximum beam scanning length of the virtual ion implantation area 14 can be implemented without changing the ion beam scanning frequency. However, since the efficiency of ion implantation cannot be improved, the pseudo-perturbation-added electric field 18 is not suitable for the purpose of implementing the beam scanning length which is smaller than the maximum beam scanning length of the virtual ion implantation area 14 in accordance with the shape of the small-sized semiconductor wafer 15 without changing the ion beam scanning frequency in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production.

Figure 10:
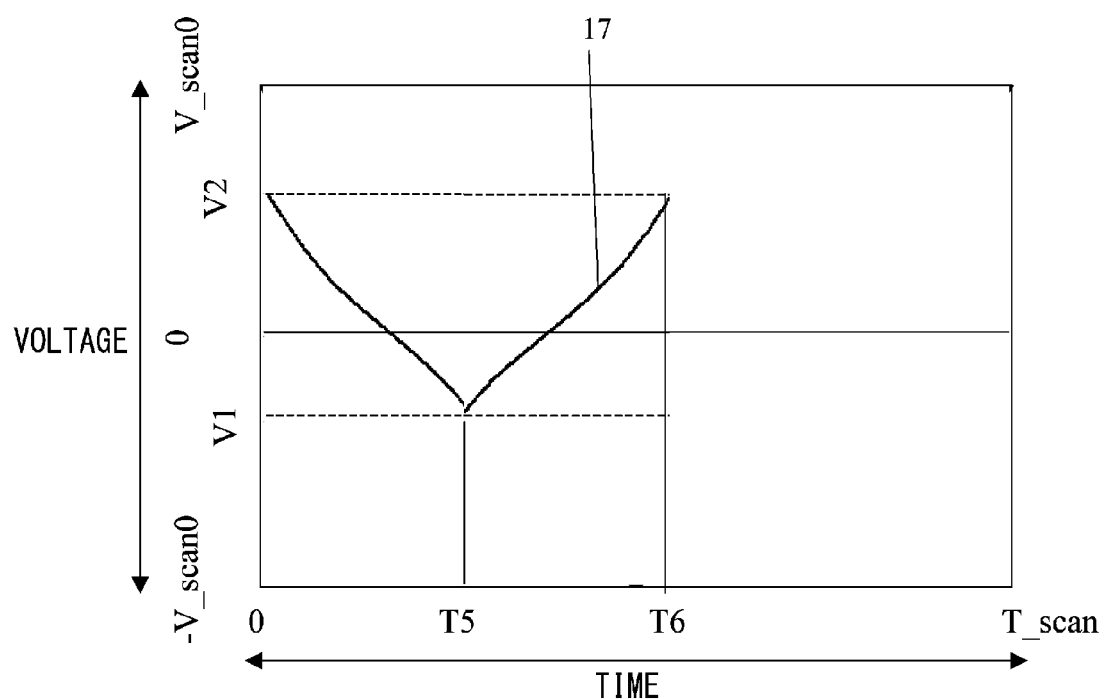
FIG. 10 is a diagram illustrating another example of a relationship between an electric field which is to be applied to a beam scanner and time.

Herein, another example of implementing the beam scanning length which is smaller than the maximum beam scanning length of the virtual ion implantation area 14 will be described with reference to FIG. 10. FIG. 10 is a diagram illustrating another example of a relationship between an electric field which is to be applied to the beam scanner and time. As described above with reference to FIG. 9, for example, in the case illustrated in FIG. 10, since the positions of the ion beam at the two ends of the beam scanning length which is smaller than the maximum beam scanning length can be expressed by using the maximum value V2 (V) and the minimum value V1 (V) as voltages applied to the beam scanner 5, neither voltage of V2 (V) or more nor voltage of V1 (V) or less is allowable as the voltage applied to the beam scanner 5 in order to implement the beam scanning length which is smaller than the maximum beam scanning length. Therefore, in order to implement the beam scanning length which is smaller than the maximum beam scanning length of the virtual ion implantation area 14, a method of applying a time-varying voltage to the beam scanner 5, for example, as illustrated in FIG. 10 is considered.

The perturbation-added electric field 17 illustrated in FIG. 10 is described in brief. The perturbation-added electric field 17 is a voltage applied to the beam scanner 5 which has the perturbation-added electric field 17 obtained for the maximum beam scanning length of the virtual ion implantation area 14 set from the time point T1 to the time point T2 in FIG. 8 from the time point 0 to the time point T5 and the perturbation-added electric field 17 obtained for the maximum beam scanning length of the virtual ion implantation area 14 set from the time point T3 to the time point T4 in FIG. 8 from the time point T5 to the time point T6.

In this case, it is clear that, since the voltage applied to the beam scanner 5 is in a range between the maximum value V2 (V) and the minimum value V1 (V) and the ion beam always continues to be scanned in the X-scanning direction, the efficiency of ion implantation can be improved. However, in the perturbation-added electric field 17 of FIG. 10, the electric field repetition period becomes shorter than T_scan (sec).

In other words, it is clear that, in the perturbation-added electric field 17 illustrated in FIG. 10, the beam scanning length which is smaller than the maximum beam scanning length of the virtual ion implantation area 14 is implemented in a situation where the efficiency of ion implantation can be improved. However, since the ion beam scanning frequency is changed, the perturbation-added electric field 17 is not suitable for the purpose of implementing the beam scanning length which is smaller than the maximum beam scanning length of the virtual ion implantation area 14 in accordance with the shape of the small-sized semiconductor wafer 15 without changing the ion beam scanning frequency in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production.

As can be understood from the description hereinbefore, with respect to the pseudo-perturbation-added electric field 18 illustrated in FIG. 9 or the perturbation-added electric field 17 illustrated in FIG. 10, the beam scanning length which is smaller than the maximum beam scanning length of the virtual ion implantation area 14 cannot be implemented in accordance with the shape of the small-sized semiconductor wafer 15 without changing the ion beam scanning frequency in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production.

Figure 11:
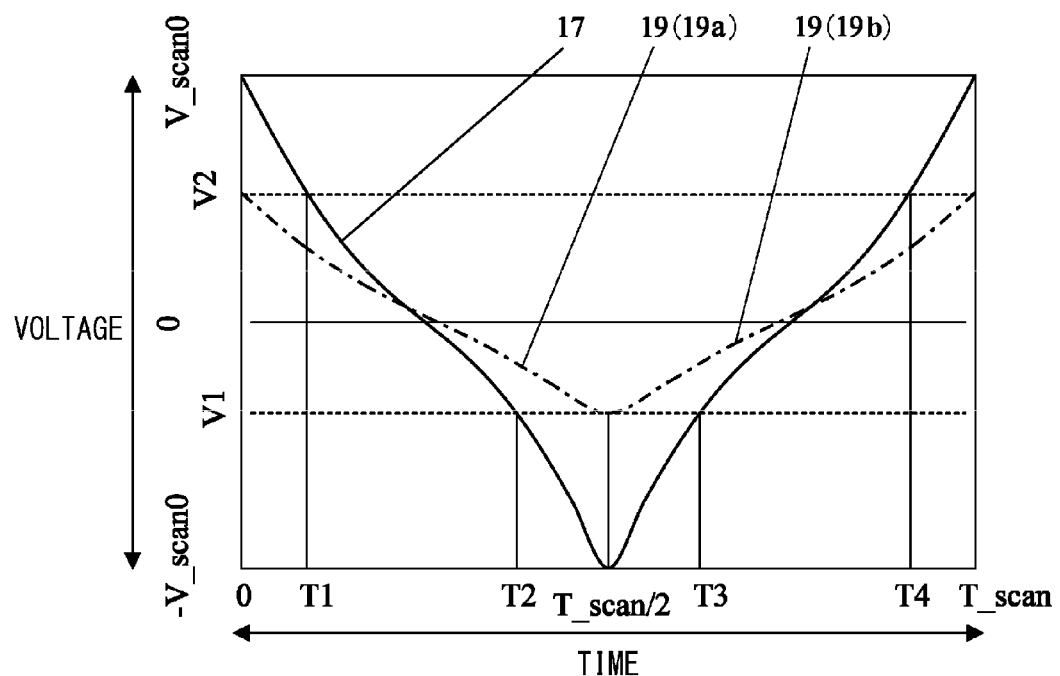
FIG. 11 is a diagram illustrating an example of a transformed perturbation-added electric field according to the embodiment.

Herein, a method of obtaining a voltage applied to the beam scanner 5 so as to implement the beam scanning length which is smaller than the maximum beam scanning length of the virtual ion implantation area 14 in the ion implantation apparatus according to the embodiment with reference to FIG. 11 will be described in detail. FIG. 11 is a diagram illustrating an example of a transformed perturbation-added electric field according to the embodiment. As described above with reference to FIG. 9 or FIG. 10, for example, in the case of FIG. 11, since the positions of the ion beam at the two ends of the beam scanning length which is shorter than the maximum beam scanning length can be expressed by using the maximum value V2 (V) and the minimum value V1 (V) as the voltages applied to the beam scanner 5, in order to implement the beam scanning length which is smaller than the maximum beam scanning length, neither a voltage of V2 (V) or more nor a voltage of V1 (V) or less is allowable as the voltage applied to the beam scanner 5. In the embodiment, in the case of implementing the beam scanning length which is smaller than the maximum beam scanning length of the virtual ion implantation area 14 indicated by the dotted line in FIG. 11, a portion of the perturbation-added electric field 17 obtained for the maximum beam scanning length of the virtual ion implantation area 14 indicated by the solid line in FIG. 11 is not directly used as the transformed perturbation-added electric field 19 applied to the beam scanner 5, but a transformed perturbation-added electric field 19 is newly generated by transforming the perturbation-added electric field 17.

Herein, in FIG. 11, a method of transforming the perturbation-added electric field 17 obtained for the maximum beam scanning length to the transformed perturbation-added electric field 19 for the beam scanning length which is shorter than the maximum beam scanning length will be described in detail. As described above with reference to FIG. 9 or 10, in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production, it is required to implement the beam scanning length which is smaller than the maximum beam scanning length of the virtual ion implantation area 14 without changing the electric field repetition period, that is, without changing the ion beam scanning frequency. In order to meet the requirement, in the embodiment, the perturbation-added electric field 17 set from a time point T1 to a time point T2 obtained for the maximum beam scanning length of the virtual ion implantation area 14 is allowed to be extended in time from a time point 0 to a time point T_scan/2, and the electric field obtained by this method is denoted by a transformed perturbation-added electric field 19a set from the time point 0 to the time point T_scan/2 for the beam scanning length which is shorter than the maximum beam scanning length. In addition, the perturbation-added electric field 17 set from a time point T3 to a time point T4 obtained for the maximum beam scanning length of the virtual ion implantation area 14 is allowed to be extended in time from a time point T_scan/2 to a time point T_scan, and the obtained electric field is denoted by a transformed perturbation-added electric field 19b set from the time point T_scan/2 to the time point T_scan for the beam scanning length which is shorter than the maximum beam scanning length. As a result, the transformed perturbation-added electric field 19 applied to the beam scanner 5 can be obtained in order to implement the beam scanning length which is smaller than the maximum beam scanning length of the virtual ion implantation area 14.

In mathematical expression, in the case where the perturbation-added electric field 17 (V_norm) obtained for the maximum beam scanning length is expressed by a relation equation V_norm=f(t) as a function of time t, the transformed perturbation-added electric field 19 (V_trans) for the beam scanning length which is shorter than the maximum beam scanning length is expressed by a relation equation V_trans=f(a×t+T1) from the time point 0 to the time point T_scan/2 and a relation equation V_trans=f(b×(t−T_scan/2)+T3) from the time point T_scan/2 to the time point T_scan. Herein, a=(2×(T2−T1))/T_scan, and b=(2×(T4−T3))/T_scan.

As can be understood from the description hereinbefore with reference to FIG. 11, in the method of transforming the perturbation-added electric field 17 obtained for the maximum beam scanning length into the transformed perturbation-added electric field 19 for the beam scanning length which is shorter than the maximum beam scanning length, if the perturbation-added electric field 17 and the correspondence determined according to the shape of the beam scanner 5 between the voltage applied to the beam scanner 5 and the position of the ion beam in the X-scanning direction are obtained, it is possible to obtain the transformed perturbation-added electric field 19 for the beam scanning length which is shorter than the maximum beam scanning length. In other words, with respect to the beam scanning length which is shorter than the maximum beam scanning length, it is not necessary to directly obtain the perturbation-added electric field 17 by using the spatial position dependency of the measured beam current value of the ion beam before the ion implantation into the small-sized semiconductor wafer 15. Alternatively, it may be said that the periodically-varying electric field for the ion beam scanning amplitudes other than the largest ion beam scanning amplitude among a plurality of the ion beam scanning amplitudes, used to implement the shape of the virtual ion implantation area 14 in accordance with the shape of the small-sized semiconductor wafer 15 in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production as illustrated in FIG. 7, is automatically obtained through calculation from the perturbation-added electric field 17 for the largest ion beam scanning amplitude.

The method of obtaining the voltage applied to the beam scanner 5 in order to implement the beam scanning length which is smaller than the maximum beam scanning length of the virtual ion implantation area 14 according to the embodiment described with reference to FIG. 11 is a method which is satisfied if the beam scanning length of the virtual ion implantation area 14 is a beam scanning length which is shorter than the maximum beam scanning length, and it is clear that a plurality of beam scanning lengths which are smaller than the maximum beam scanning length of the virtual ion implantation area 14 can be obtained. In addition, as can be understood from the description with reference to FIG. 11, the method of obtaining the voltage applied to the beam scanner 5 in order to implement the beam scanning length which is smaller than the maximum beam scanning length of the virtual ion implantation area 14 according to the embodiment is based on only the magnitude relationship between V1 (V) and V2 (V) as the presumption, but it is not based on the positive and negative signs of the voltage applied to the beam scanner 5 as the presumption. This meaning is that, in comparison with the case where no voltage is applied to the beam scanner 5, the two beam scanning end positions in the X-scanning direction corresponding to the two ends of the beam scanning length which is smaller than the maximum beam scanning length may be configured so that the one end is located at the lower side in FIG. 1A and the other end is located in the upper side, so that the two ends are located at the lower side, or so that the two ends are located at the upper side.

In addition, it is clear that the method according to the embodiment described with reference to FIG. 11 is similarly adapted to the beam scanner 5 using the periodically-varying magnetic field, which is applied for the purpose of scanning the ion beam in one direction in the ion implantation area space.

In this manner, since the method of transforming the perturbation-added electric field 17 obtained for the maximum beam scanning length into the transformed perturbation-added electric field 19 for the beam scanning length which is smaller than the maximum beam scanning length is used according to the embodiment described with reference to FIG. 11, in the case where ions are implanted into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production, for the purpose of implementing the beam scanning length which is smaller than the maximum beam scanning length of the virtual ion implantation area 14 in accordance with the shape of the small-sized semiconductor wafer 15, in the situation where the improvement of the efficiency of ion implantation can be achieved, the beam scanning length which is smaller than the maximum beam scanning length of the virtual ion implantation area 14 can be implemented without changing the ion beam scanning frequency while securing the uniformity of X-scan-direction ion implantation dose.

Furthermore, in the embodiment, the speed of the mechanical scanning of the small-sized semiconductor wafer 15 performed by using the mechanical scanning device 13 is further controlled, so that the uniformity of Y-scan-direction ion implantation dose is secured. Therefore, while securing the uniformity of X-scan-direction ion implantation dose due to the transformed perturbation-added electric field 19, the ion implantation dose to be implanted per unit area into the small-sized semiconductor wafer 15 is maintained constant. Hereinafter, this will be described in detail.

Figure 12:
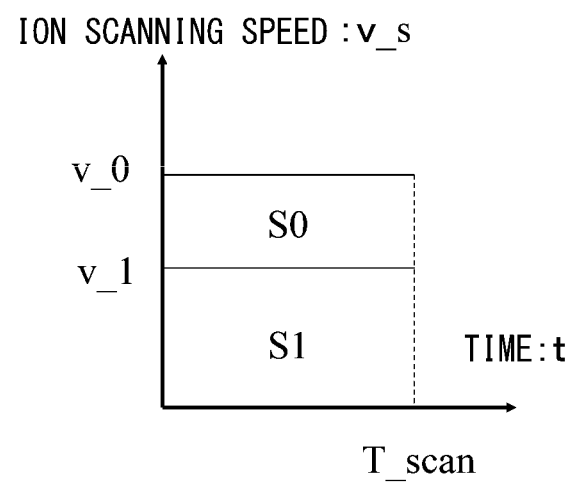
FIG. 12 is a diagram illustrating relationships between an ion beam scanning speed and a beam scanning length and between an electric field repetition period and a beam scanning length.

Herein, ion implantation doses of the cases of using different beam scanning lengths in the same ion beam scanning frequency will be described with reference to FIG. 12. FIG. 12 is a diagram illustrating relationships between an ion beam scanning speed and a beam scanning length and between an electric field repetition period and a beam scanning length. In addition, as described above with reference to FIG. 11, in the ion implantation into the actual small-sized semiconductor wafer 15, the perturbation-added electric field 17 and the transformed perturbation-added electric field 19 are used in order to secure the uniformity of X-scan-direction ion implantation dose. However, in FIG. 12, it is said that the perturbation is sufficiently small. Needless to say, the same description with reference to FIG. 12 is valid even in the case where a magnitude of the perturbation is not negligible.

In FIG. 12, the horizontal axis denotes an electric field repetition period, and the vertical axis denotes an ion beam scanning speed. As described above, the electric field repetition period is a reciprocal of the ion beam scanning frequency and has a predetermined value T_scan. In addition, generally, the beam scanning length is expressed by a time integral of the ion beam scanning speed. In FIG. 12, the ion beam scanning speed for the maximum beam scanning length S0 is indicated by v_0, and the ion beam scanning speed for the beam scanning length S1 which is smaller than the maximum beam scanning length is indicated by v_1. As can be seen from FIG.

12, in the case where different beam scanning lengths are used at the same ion beam scanning frequency, the ion beam scanning speed is also changed. Therefore, in the method of scanning the small-sized semiconductor wafer 15 at a constant speed by using the mechanical scanning device 13, which is used in the case where the virtual ion implantation area 14 has a rectangular shape, in order to secure the uniformity of Y-scan-direction ion implantation dose, since the ion beam scanning speed is changed according to the beam scanning length, the ion implantation dose to be implanted per unit time and unit area is also changed in accordance to the change in the ion beam scanning speed, so that the uniformity of Y-scan-direction ion implantation dose cannot be secured.

Therefore, in the embodiment, the ion implantation dose to be implanted per unit area is maintained constant by allowing the scanning speed for the small-sized semiconductor wafer 15 to be changed simultaneously when the periodically-varying electric field is allowed to be changed according to the beam scanning length during the ion implantation, so that the uniformity of Y-scan-direction ion implantation dose can be secured. As a result, the ion implantation dose to be implanted per unit area is allowed to be maintained constant. Hereinafter, this will be described in detail.

Figure 13:
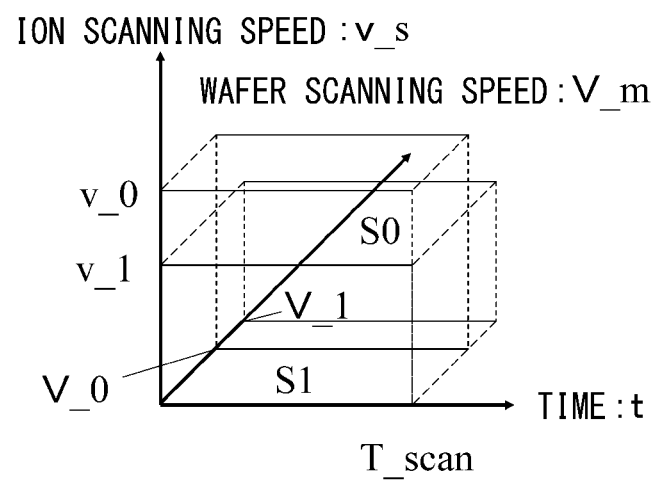
FIG. 13 is a diagram illustrating relationships between an ion beam scanning speed and an ion implantation dose, between a wafer scanning speed and the ion implantation dose, and between an electric field repetition period and the ion implantation dose.

Herein, a method of securing the uniformities of ion implantation doses to be implanted per unit area in the embodiment will be described with reference to FIG. 13. FIG. 13 is a diagram illustrating relationships between an ion beam scanning speed and an ion implantation dose, between a wafer scanning speed and the ion implantation dose, and between an electric field repetition period and the ion implantation dose. In the case of considering an ion implantation dose in an ion implantation apparatus, typically one-dimensional ion implantation dose, that is, only the ion beam scanning speed may be considered. However, strictly speaking, the ion implantation dose needs to be two-dimensionally treated. For example, in the example of FIG. 7, since the small-sized semiconductor wafer 15 is mechanically scanned by the mechanical scanning device 13 in the direction, that is, the Y-scanning direction perpendicular to the ion beam scanning direction, that is, the X-scanning direction, the wafer scanning speed controlled by the mechanical scanning device 13 needs to be taken into consideration. In the case where the virtual ion implantation area 14 has a rectangular shape, since the uniformity of Y-scan-direction ion implantation dose is secured by using the method of mechanical scanning of the small-sized semiconductor wafer 15 at a constant speed, the wafer scanning speed seems to be treated as if the wafer scanning speed is not taken into consideration.

Herein, in order to collectively examine the relationship among the ion beam scanning frequency, the beam scanning length, and the wafer scanning speed, it is convenient to use a three-dimensional space having three sides of an implantation time t, an ion beam scanning speed $v\_s$, and a wafer scanning speed $V\_s$ as illustrated in FIG. 13. Herein, in general, the ion implantation dose is inversely proportional to the product $v\_s \times V\_s$ of the ion beam scanning speed $v\_s$ and the wafer scanning speed $V\_s$.

As described above with reference to FIG. 12, since the ion beam scanning speed for the maximum beam scanning length S0 is $v\_0$ and the ion beam scanning speed for the beam scanning length S1 which is smaller than the maximum beam scanning length $v\_1$, the two ion beam scanning speeds for the two beam scanning lengths are necessarily different from each other. In the embodiment, the ion implantation dose is maintained constant by intentionally changing the wafer scanning speeds with respect to the different ion beam scanning speeds. In the case of FIG. 13, the ion implantation dose is maintained constant by determining the relationship between the wafer scanning speed $V\_0$ for the maximum beam scanning length S0 and the wafer scanning speed $V\_1$ for the beam scanning length S1 which is smaller than the maximum beam scanning length so that the product $v\_0 \times V\_0$ and the product $v\_1 \times V\_1$ are maintained constant. In other words, according to the embodiment, the ion implantation dose to be implanted per unit area can be maintained constant by changing each of the mechanical scanning speeds for the small-sized semiconductor wafer 15, that is, the wafer scanning speeds according to the different ion beam scanning amplitudes.

The wafer scanning speed $V\_1$ for the beam scanning length S1 which is smaller than the maximum beam scanning length becomes higher than the wafer scanning speed $V\_0$ for the maximum beam scanning length S0. Therefore, the ratio of the wafer scanning speed $V\_1$ for the beam scanning length S1 which is smaller than the maximum beam scanning length to the wafer scanning speed $V\_0$ for the maximum beam scanning length S0 becomes more than 1. This numerical value may be regarded as a correction factor of the wafer scanning speed.

Furthermore, the correction factor of the wafer scanning speed $V\_1$ for the beam scanning length S1 which is smaller than the maximum beam scanning length with respect to the wafer scanning speed $V\_0$ for the maximum beam scanning length S0 as a reference is obtained through calculation simultaneously when the periodically-varying electric field is automatically obtained through calculation so as to transform the perturbation-added electric field 17 for the maximum beam scanning length S0 into the transformed perturbation-added electric field 19 for the beam scanning length which is shorter than the maximum beam scanning length. This can be understood from the description made above with reference to FIGS. 11 and 13.

Although the electric field type beam scanner 5 illustrated in FIGS. 1A and 1B is described with reference to FIG. 12 or 13, this is an example, and the description with reference to FIG. 12 or 13 is almost directly adapted to the magnetic field type beam scanner 5 by replacing the electric field with the magnetic field in reading.

In addition, it is clear that, the method of intentionally changing the wafer scanning speed performed so as to allow the ion implantation dose to be implanted per unit area to be maintained constant with respect to the beam scanning length which is smaller than the maximum beam scanning length of the virtual ion implantation area 14, which is described with reference to FIG. 13, is a method which is generally accepted if the beam scanning length of the virtual ion implantation area 14 is the beam scanning length which is shorter than the maximum beam scanning length, and a plurality of the beam scanning lengths which are smaller than the maximum beam scanning length of the virtual ion implantation area 14 can be obtained.

Like this, in the embodiment, plural types of the beam scanning lengths which are shorter than the maximum beam scanning length are set by using the method of transforming the perturbation-added electric field 17 obtained for the maximum beam scanning length into the transformed perturbation-added electric field 19 for the beam scanning length which is shorter than the maximum beam scanning length several times, which is described with reference to FIG. 11. Next, a plurality of the wafer scanning speeds are set with respect to the beam scanning lengths which are shorter than the maximum beam scanning length described above with reference to FIG. 13, the correction factors for the plurality of the wafer scanning speeds with respect to the wafer scanning speed with respect to the maximum beam scanning length as a reference are acquired, and the ion implantation into the small-sized semiconductor wafer 15 is performed while changing the plural types of the beam scanning lengths. Accordingly, the ion implantation dose to be implanted per unit area into the small-sized semiconductor wafer 15 is maintained constant while allowing the ion beam scanning frequency to be maintained constant during the ion implantation, so that ions can be implanted with efficiency of ion implantation suitable for practical use of a semiconductor manufacturing process for mass production while changing the ion beam scanning amplitude according to the position of the small-sized semiconductor wafer 15 as illustrated in FIG. 7. In addition, according to the embodiment, it is clear that the small-sized semiconductor wafer 15 of which radius is smaller than that of the semiconductor wafer 9 is installed in or attached to the semiconductor wafer 9 and the semiconductor wafer 9 including the small-sized semiconductor wafer 15 continues to be irradiated with ions from the start time of the ion implantation into the small-sized semiconductor wafer 15 to the end time of the ion implantation without performing beam current measurement, so that ion implantation dose to be implanted per unit area into the small-sized semiconductor wafer 15 can be maintained constant.

In addition, in the description hereinbefore, since the mechanical scanning for the small-sized semiconductor wafer 15 does not need to be stopped during the ion implantation, in the embodiment, the ion implantation can be performed with efficiency of ion implantation suitable for practical use of a semiconductor manufacturing process for mass production without stopping the scanning for the small-sized semiconductor wafer 15 while changing the ion beam scanning amplitude according to the shape of the small-sized semiconductor wafer 15.

Furthermore, as described above, in the transformation into the transformed perturbation-added electric field 19 for the beam scanning length which is shorter than the maximum beam scanning length, the perturbation-added electric field 17 obtained for the maximum beam scanning length before the ion implantation into the small-sized semiconductor wafer 15 and the correspondence between the voltage applied to the beam scanner 5 and the position of the ion beam in the X-scanning direction determined according to the shape of the beam scanner 5 need to be obtained. In addition, in the derivation of the wafer scanning speed for the beam scanning length which is shorter than the maximum beam scanning length or the correction factor of the wafer speed for the beam scanning length which is shorter than the maximum beam scanning length by setting the wafer scanning speed for the maximum beam scanning length as a reference, the perturbation-added electric field 17 obtained for the maximum beam scanning length and the transformed perturbation-added electric field 19 for the beam scanning length which is shorter than the maximum beam scanning length are necessary. In other words, the measurement of the ion beam current value is unnecessary during the ion implantation into the small-sized semiconductor wafer 15. Therefore, in the embodiment, ions can be implanted with efficiency of ion implantation suitable for practical use of a semiconductor manufacturing process for mass production without measuring the ion beam current value during the ion implantation into the small-sized semiconductor wafer 15 while changing the ion beam scanning amplitude according to the shape of the small-sized semiconductor wafer 15.

Herein, it should be noted that the shape and area of the virtual ion implantation area 14 are not limited to the shape and area illustrated in FIG. 7. Hereinafter, a specific situation is illustrated, and which shape and area are required as those of the virtual ion implantation area 14 is illustrated. After that, it is illustrated that the method according to the embodiment can be adapted to these required shape and area of the virtual ion implantation area 14.

Herein, first, with respect to the area of the virtual ion implantation area 14, a case where an area different from the area illustrated in FIG. 7 is required will be described with reference to FIG. 14. As described above, for example, the case where the shape of the virtual ion implantation area 14 is controlled to be a shape which can be approximated to a circle in accordance with the shape of the small-sized semiconductor wafer 15 and the area of the virtual ion implantation area 14 is controlled so as to be adapted to the area of the small-sized semiconductor wafer 15 in order to implant ions into the small-sized semiconductor wafer 15 which is smaller than the semiconductor wafer 9 corresponding to the hybrid scanning single-wafer processing type ion implantation apparatus with efficiency of ion implantation suitable for practical use of a semiconductor manufacturing process for mass production is illustrated in FIG. 7. In this manner, the improvement of the efficiency of ion implantation by controlling the shape of the virtual ion implantation area 14 to be an approximately circle in accordance with the shape of the semiconductor wafer is not limited to the case of implanting ions into the small-sized semiconductor wafer 15 which is smaller than the semiconductor wafer 9 corresponding to the hybrid scanning single-wafer processing type ion implantation apparatus. For example, as illustrated in FIG. 14, in the case of implanting ions the semiconductor wafer 9 itself corresponding to the hybrid scanning single-wafer processing type ion implantation apparatus, the efficiency of ion implantation can be improved by controlling the shape of the virtual ion implantation area 14 to be an approximately circle in accordance with the shape of the semiconductor wafer.

Figure 14:
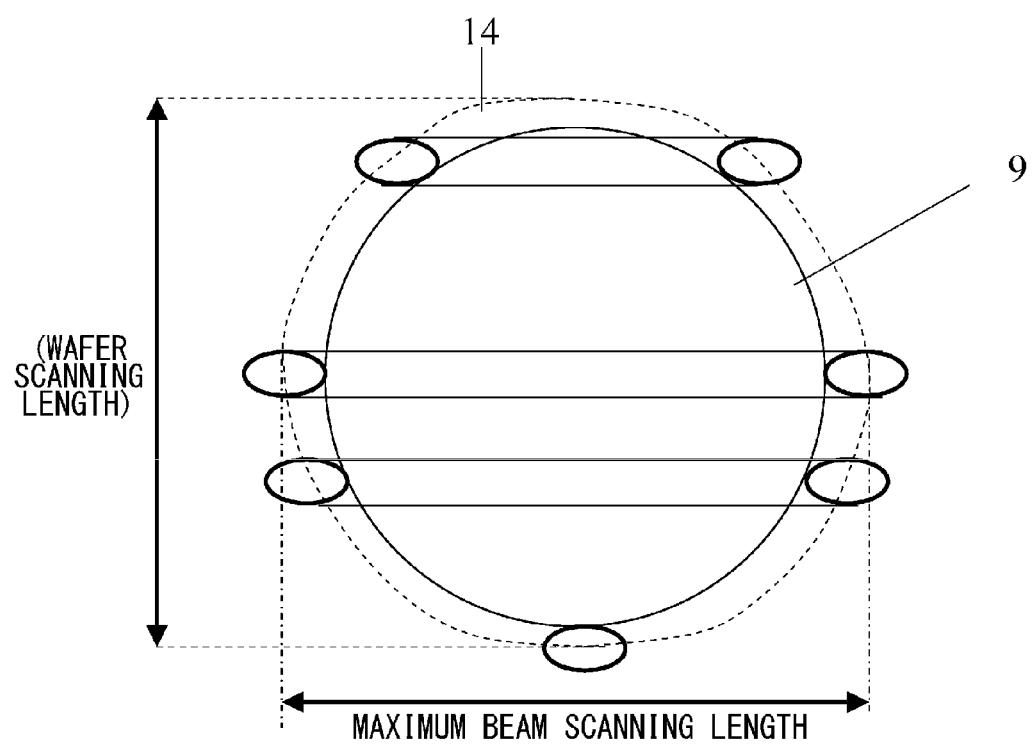
FIG. 14 is a diagram illustrating an example of a virtual ion implantation area according to the embodiment in the case where ions are implanted into a semiconductor wafer corresponding to the hybrid scanning single-wafer processing type ion implantation apparatus.

FIG. 14 is a diagram illustrating an example of the virtual ion implantation area 14 according to the embodiment in the case where ions are implanted into the semiconductor wafer 9 corresponding to the hybrid scanning single-wafer processing type ion implantation apparatus. As described above, when the ions are to be implanted into the semiconductor wafer 9, it is important that the ion implantation is performed so that the ion implantation dose to be implanted per unit area is maintained constant over the entire surface of the semiconductor wafer 9. Herein, the shape of the virtual ion implantation area 14 for the semiconductor wafer 9 is configured to be similar to the shape of the virtual ion implantation area 14 for the small-sized semiconductor wafer 15, and only the area is configured to be different. Therefore, the method of implementing the uniformity of the ion implantation dose over the entire surface of the semiconductor wafer 9 in the case of controlling the shape of the virtual ion implantation area 14 to be an approximately circle in accordance with the shape of the semiconductor wafer 9 illustrated in FIG. 12 is the same as the method of implementing the uniformity of the ion implantation dose over the entire surface of the small-sized semiconductor wafer 15 in the above-described case of controlling the shape of the virtual ion implantation area 14 to be an approximately circle in accordance with the shape of the small-sized semiconductor wafer 15. However, the different point is that the semiconductor wafer 9 is completely included in the virtual ion implantation area 14. In addition, it may be said that, in the case of implanting ions into the semiconductor wafer 9, the virtual ion implantation area 14 includes a planar area shaped by the semiconductor wafer 9.

As can be understood from the description with reference to FIGS. 7 and 14, if the method according to the embodiment is used, in the case of implanting ions into the semiconductor wafer 9, since the virtual ion implantation area 14 includes the planar area shaped by the semiconductor wafer 9, it may be configured so that the ion beam is continuously implanted into the semiconductor wafer 9 from the implantation start time to the implantation end time, and it may be configured so that the virtual ion implantation area 14 includes the planar area shaped by the semiconductor wafer 9. The plural configuration methods may be used individually according to the purposes. Furthermore, if the semiconductor wafer retainer 10 (not shown) retaining the semiconductor wafer 9 illustrated in FIG. 9 is considered, since the semiconductor wafer retainer 10 and the semiconductor wafer 9 are almost the same in terms of shape and area, it may also be said that the ion implantation method illustrated in FIG. 14 is an ion implantation method where the virtual ion implantation area 14 includes the planar area shaped by the semiconductor wafer retainer 10.

Figure 15:
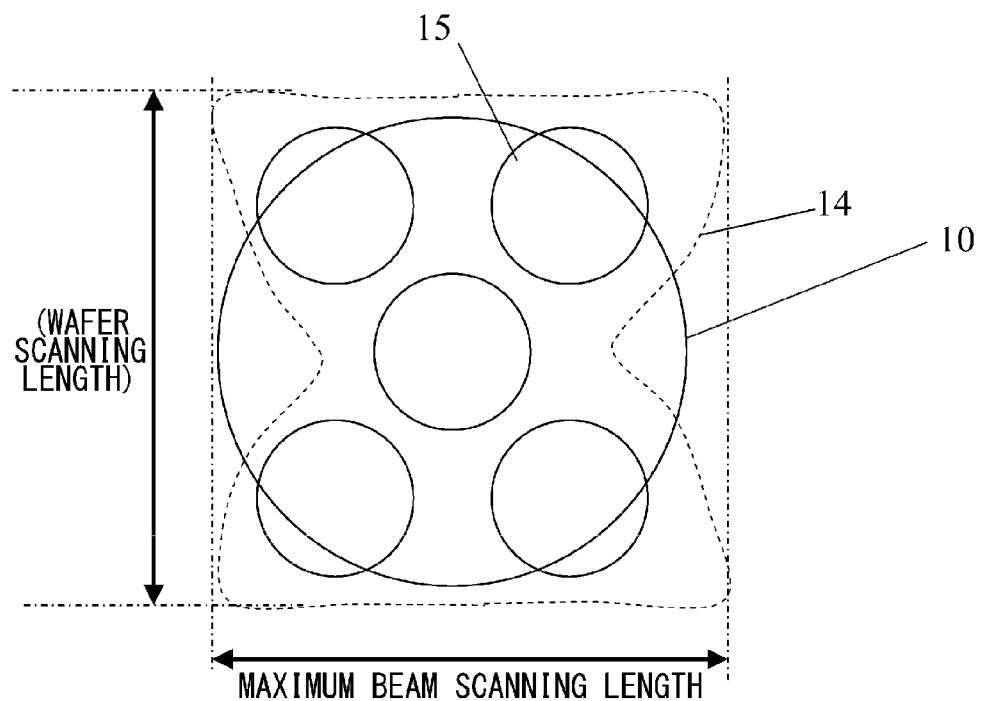
FIG. 15 is a diagram illustrating a state where five small-sized semiconductor wafers are arranged in a semiconductor wafer retainer.

Herein, a case where an area and shape of the virtual ion implantation area 14 different from the area and shape illustrated in FIG. 7 or 14 are required will be described with reference to FIG. 15. In FIG. 15, in the hybrid scanning single-wafer processing type ion implantation apparatus corresponding to the semiconductor wafer 9, the case of appropriately controlling the shape and area of the virtual ion implantation area 14 in accordance with the shapes of the five small-sized semiconductor wafers 15 in order to implant ions into the five small-sized semiconductor wafers 15 which are smaller than the semiconductor wafer 9 with efficiency of ion implantation suitable for practical use of a semiconductor manufacturing process for mass production will be described.

FIG. 15 is a diagram illustrating a state where the five small-sized semiconductor wafers 15 are arranged in the semiconductor wafer retainer 10. Although various arrangement methods for the five small-sized semiconductor wafers 15 may be considered, for example, the arrangement method for the five small-sized semiconductor wafers 15 illustrated in FIG. 15 is considered. In this case, it may be said that the shape of the virtual ion implantation area 14 in accordance with the shapes of the five small-sized semiconductor wafers 15 in order to implant ions into the five small-sized semiconductor wafers 15 with efficiency of ion implantation suitable for practical use of a semiconductor manufacturing process for mass production is, for example, a drum-like shape as illustrated in FIG. 15.

Needless to say, the arrangement method for the five small-sized semiconductor wafers 15 is not limited to the arrangement method illustrated in FIG. 15, the shape of the virtual ion implantation area 14 in accordance with the shapes of the five small-sized semiconductor wafers 15 in order to implant ions into the five small-sized semiconductor wafers 15 with efficiency of ion implantation suitable for practical use of a semiconductor manufacturing process for mass production is not limited to the drum-like shape as illustrated in FIG. 15.

As described above, in the transformation into the transformed perturbation-added electric field 19 for the beam scanning length which is shorter than the maximum beam scanning length, it is necessary to obtain the perturbation-added electric field 17 obtained for the maximum beam scanning length before the ion implantation into the small-sized semiconductor wafers 15 and the correspondence determined according to the shape of the beam scanner 5 between the voltage applied to the beam scanner 5 and the position of the ion beam in the X-scanning direction. In addition, in the derivation of the wafer scanning speed for the beam scanning length which is shorter than the maximum beam scanning length or the correction factor of the wafer speed for the beam scanning length which is shorter than the maximum beam scanning length by setting the wafer scanning speed for the maximum beam scanning length as a reference, only the perturbation-added electric field 17 obtained for the maximum beam scanning length and the transformed perturbation-added electric field 19 for the beam scanning length which is shorter than the maximum beam scanning length are necessary. Herein, particularly, the condition as to where the maximum beam scanning length exists in the Y-scanning direction of the semiconductor wafer retainer 10 is unnecessary.

In other words, in the description with reference to FIG. 14, the maximum beam scanning length exist in the vicinity of the central portion in the Y-scanning direction of the semiconductor wafer retainer 10; and however, the maximum beam scanning length exists at the two ends in the Y-scanning direction of the semiconductor wafer retainer 10 in FIG. 15. In the embodiment, since the shape and area of the virtual ion implantation area 14 can be controlled without performing the measurement of the ion beam current value during the ion implantation, the maximum beam scanning length may exist at any position in the Y-scanning direction of the semiconductor wafer retainer 10 as described with reference to FIG. 14 or 15.

If the case of FIG. 15 is expressed by the inclusion relationship between the virtual ion implantation area 14 and the semiconductor wafer retainer 10, it may be said that the planar area shaped by the semiconductor wafer retainer 10 and the virtual ion implantation area 14 are in a relationship where the two areas do not include each other.

Figure 16:
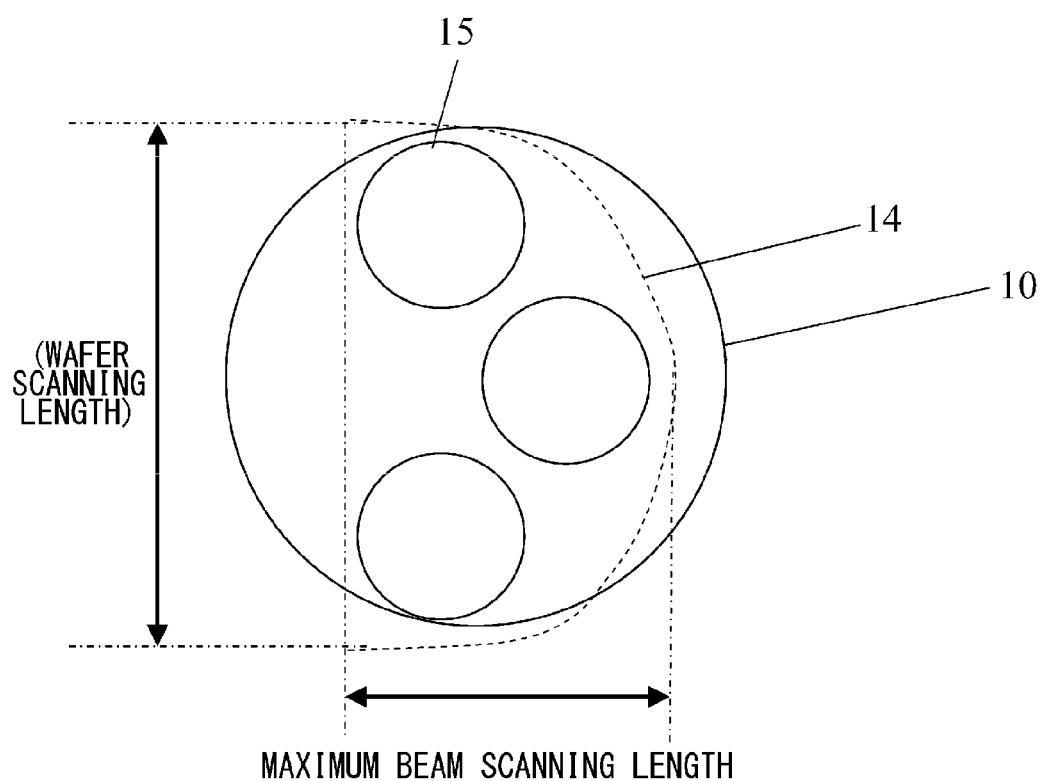
FIG. 16 is a diagram illustrating a state where three small-sized semiconductor wafers are arranged in a semiconductor wafer retainer.

Next, a case where an area and shape further different from the area and shape of the virtual ion implantation area 14 are required will be described with reference to FIG. 16. FIG. 16 is a diagram illustrating a state where the three small-sized semiconductor wafers 15 are arranged in the semiconductor wafer retainer 10. Herein, in FIG. 16, in the hybrid scanning single-wafer processing type ion implantation apparatus corresponding to the semiconductor wafer 9, the case of appropriately controlling the shape and area of the virtual ion implantation area 14 in accordance with the shapes of the three small-sized semiconductor wafers 15 in order to implant ions into three small-sized semiconductor wafers 15 which are smaller than the semiconductor wafer 9 with efficiency of ion implantation suitable for practical use of a semiconductor manufacturing process for mass production will be described.

Although various arrangement methods for the three small-sized semiconductor wafers 15 may be considered, for example, the arrangement method for the three small-sized semiconductor wafers 15 illustrated in FIG. 16 is considered. In this case, it may be said that the shape of the virtual ion implantation area 14 in accordance with the shapes of the three small-sized semiconductor wafers 15 in order to implant ions into the three small-sized semiconductor wafers 15 with efficiency of ion implantation suitable for practical use of a semiconductor manufacturing process for mass production is, for example, a D-like shape as illustrated in FIG. 16.

If the case of FIG. 16 is expressed by the inclusion relationship between the virtual ion implantation area 14 and the semiconductor wafer retainer 10, although it may be said that the planar area shaped by the semiconductor wafer retainer 10 and the virtual ion implantation area 14 are in a relationship where the two areas do not include each other, in some arrangement method for the three small-sized semiconductor wafers 15, it may be configured so that the virtual ion implantation area 14 completely includes the semiconductor wafer retainer 10.

In addition, needless to say, the shape of the virtual ion implantation area 14 in accordance with the shapes of the three small-sized semiconductor wafers 15 in order to implant ions into the three small-sized semiconductor wafers 15 with efficiency of ion implantation suitable for practical use of a semiconductor manufacturing process for mass production is not limited to the D-like shape illustrated in FIG. 16.

As described hereinbefore, the method of obtaining the voltage applied to the beam scanner 5 in order to implement the beam scanning length which is smaller than the maximum beam scanning length of the virtual ion implantation area 14 is based on the magnitude relationship between V1 (V) and the V2 (V) as the presumption, but it is not based on the positive and negative signs of the voltage applied to the beam scanner 5 as the presumption. Therefore, as illustrated in FIG. 16, the virtual ion implantation area 14 which is left-right asymmetric with respect to the central axis of the Y scanning of the small-sized semiconductor wafer 15 can be implemented.

In addition, in the embodiment, several inclusion relationships between the virtual ion implantation area 14 and the semiconductor wafer retainer 10 and several inclusion relationships between the virtual ion implantation area 14 and the semiconductor wafer 9 can be taken. This is because the shape and area of the virtual ion implantation area 14 can be controlled with not performing the measurement of the ion beam current value during the ion implantation. In addition, in the embodiment, the shape and area of the virtual ion implantation area 14 can be controlled in various manners. In addition, in the ion implantation apparatus according to the embodiment, although the shape and area of the virtual ion implantation area 14 can be controlled with not performing the measurement of the ion beam current value during the ion implantation, it does not mean that the measurement of the ion beam current value during the ion implantation do not have to be performed, but it means that the measurement is unnecessary to perform. Therefore, the measurement of the ion beam current value may be performed according to the inclusion relationships between the virtual ion implantation area 14 and the semiconductor wafer retainer 10 and the inclusion relationships between the virtual ion implantation area 14 and the semiconductor wafer 9 during the ion implantation if possible.

In addition, as can be understood from the description hereinbefore, in the embodiment, plural types of the ion beam scanning amplitudes in the ion beam scanning direction are set with respect to the shape of the virtual ion implantation area 14, the ion implantation is performed while changing the ion beam scanning amplitude according to the position of the object of the scan. Therefore, in the embodiment, various virtual ion implantation areas 14 exemplified hereinbefore can be selected. More specifically, it may be said that, in the ion implantation method, a shape approximate to a polygon having more vertexes than a regular icosagon or a circle illustrated in FIG. 7 or 14, a drum-like shape illustrated in FIG. 15, or a D-like shape illustrated in FIG. 16 can be selected as the shape of the virtual planar ion implantation area, that is, the virtual ion implantation area 14.

In addition, the shape of the virtual ion implantation area 14 is not limited to the shape exemplified hereinbefore. For example, an up-down asymmetric virtual ion implantation area 14 can be implemented.

Hereinbefore, as described above, according to the ion implantation method according to the embodiment, in the hybrid scanning single-wafer processing type ion implantation apparatus, while allowing the ion beam scanning frequency to be maintained constant during the ion implantation and allowing the ion implantation dose to be implanted per unit area to be maintained constant, it is possible to improve wafer productivity according to situations with respect to the size of the semiconductor wafer of the ion implantation and the number of simultaneously implanted semiconductor wafers.

Hereinafter, several aspects of the present invention will be described.

In an ion implantation method according to an aspect, ions generated by an ion source is transported as an ion beam to an ion implantation area space; in the case of implanting the ions into an object in the ion implantation area space; a periodically-varying electric field or a periodically-varying magnetic field is applied to the ions during the transportation of the ion beam; the ion beam scans in one direction in the ion implantation area space; the object is scanned in the direction perpendicular to the ion beam scanning direction; in the case where a relative relationship between the ions and the object with respect to the ions implanted into the object is a virtual planar ion implantation area due to the two types of the scans, an ion implantation dose to be implanted per unit area is maintained constant in the virtual planar ion implantation area and a frequency of the scanning where the ion beam scans in one direction is maintained constant; plural types of ion beam scanning amplitudes in the ion beam scanning direction are set with respect to the shape of the virtual planar ion implantation area; and the ion implantation is performed while changing the ion beam scanning amplitude according to a position of the object of the scanning without stopping the object scan. The ion implantation method is characterized in that the measurement of the ion beam current value is not always performed or never performed during the ion implantation in the ion implantation area space.

In addition, with respect to the periodically-varying electric field or the periodically-varying magnetic field which is applied for the purpose of scanning the ion beam in one direction in the ion implantation area space and is exerted on the ions during the transportation of the ion beam, the periodically-varying electric field or the periodically-varying magnetic field for the largest ion beam scanning amplitude among a plurality of the ion beam scanning amplitudes is set as a reference; the periodically-varying electric field or the periodically-varying magnetic field for the ion beam scanning amplitude other than the largest ion beam scanning amplitude among a plurality of the ion beam scanning amplitudes is obtained based on the reference; the ion beam scanning amplitude is changed by changing the periodically-varying electric field or the periodically-varying magnetic field according to the position of the object of the scan; the periodically-varying electric field or the periodically-varying magnetic field is a function of time; and a control function is obtained by setting a periodically-repeating triangular shape as a reference, using spatial position dependency of the measured beam current value of the ion beam before the ion implantation; and adding perturbation besides the periodically-repeating triangular shape to the periodically-varying electric field or the periodically-varying magnetic field. In addition, as one of the characteristics, the periodically-varying electric field or the periodically-varying magnetic field for the ion beam scanning amplitude other than the largest ion beam scanning amplitude among a plurality of the ion beam scanning amplitudes is automatically obtained through calculation.

In addition, in an ion implantation apparatus according to an aspect, ions generated by an ion source is transported as an ion beam to an ion implantation area space; in the ion implantation apparatus which implants ions into an object in the ion implantation area space; a periodically-varying electric field or a periodically-varying magnetic field is applied to the ions during the transportation of the ion beam; the ion beam scans in one direction in the ion implantation area space; the object is scanned in the direction perpendicular to the ion beam scanning direction; in the case where a relative relationship between the ions and the object with respect to the ions implanted into the object is a virtual planar ion implantation area due to the two types of the scans, an ion implantation dose to be implanted per unit area is maintained constant in the virtual planar ion implantation area and a frequency of the scanning where the ion beam scans in one direction is maintained constant; plural types of ion beam scanning amplitudes in the ion beam scanning direction are set with respect to the shape of the virtual planar ion implantation area; and the ion implantation is performed while changing the ion beam scanning amplitude according to a position of the object of the scanning without stopping the object scan. The ion implantation apparatus is characterized in that the measurement of the ion beam current value is unnecessary during the ion implantation in the ion implantation area space.

In the above-described ion implantation method or ion implantation apparatus, since the ion implantation dose to be implanted per unit area is maintained constant in the virtual planar ion implantation area, the largest ion beam scanning amplitude is selected among the plural types of the ion beam scanning amplitudes in the ion beam scanning direction; with respect to the largest ion beam scanning amplitude, a control function of securing uniformity of the ion implantation dose in the ion beam scanning direction is obtained by using the spatial position dependency of the measured beam current value of the ion beam before the ion implantation; and control functions with respect to the plural types of the ion beam scanning amplitudes may be automatically obtained from the control function with respect to the largest ion beam scanning amplitude through calculation.

In addition, in the above-described ion implantation method or ion implantation apparatus, since the ion implantation dose to be implanted per unit area is maintained constant in the virtual planar ion implantation area while allowing the frequency of the scanning where the ion beam scans in one direction to be maintained constant, the periodically-varying electric field or the periodically-varying magnetic field may be obtained from the plural types of control functions with respect to the plural types of the ion beam scanning amplitudes. In addition, the ion implantation may be performed while changing the ion beam scanning amplitude by changing the periodically-varying electric field or the periodically-varying magnetic field according to the position of the object of the scan.

In addition, in the above-described ion implantation method or ion implantation apparatus, the ion implantation dose to be implanted per unit time and unit area may be maintained constant in the virtual planar ion implantation area by changing the mechanical scanning speed of the object according to a plurality of the ion beam scanning amplitudes.

In addition, in the above-described ion implantation method or ion implantation apparatus, in the case where the largest ion beam scanning amplitude is selected among the plural types of the ion beam scanning amplitudes in the ion beam scanning direction, the position of the largest ion beam scanning amplitude may be configured to be set to any position in the virtual planar ion implantation area.

In addition, in the above-described ion implantation method or ion implantation apparatus, a semiconductor wafer holder may be used, a semiconductor wafer may be installed in the semiconductor wafer holder, and the ion implantation dose to be implanted per unit area into the semiconductor wafer may be maintained constant without performing the measurement of the beam current.

In addition, an ion implantation method according to another aspect is an ion implantation method using hybrid scanning where an ion beam is allowed to scan and a wafer is allowed to be scanned in the direction intersecting the ion beam scanning direction. In addition, the method includes a process of setting the ion beam scanning speed and the mechanical scanning speed of the object during the ion implantation in advance and a process of implanting ions based on the set ion beam scanning speed (for example, $v\_0$ or $v\_1$ illustrated in FIG. 13) and the set mechanical scanning speed of the object (for example, $V\_0$ or $V\_1$ illustrated in FIG. 13). In the process of setting in advance, a plurality of the ion beam scanning speeds (for example, $v\_0$ or $v\_1$ illustrated in FIG. 13) are set based on the ion beam scanning amplitudes (beam scanning length S0 or S1) which are changed according to the surface outline of the object irradiated with the ions so that the ion beam scanning frequency ($1/(T\_scan)$) is maintained constant, and the mechanical scanning speed of the object (for example, $V\_0$ or $V\_1$ illustrated in FIG. 13) corresponding to the ion beam scanning speed is set so that the ion implantation dose per unit area implanted into the surface of the object is maintained constant.

According to the aspect, the ion implantation dose can be maintained constant without performing the measurement of the ion beam current amount.

The above-described ion implantation method may further include a process of measuring the ion beam current amount at a predetermined timing during the scanning where the entire object is scanned with the ion beam. In addition, in the process, the number of times of the measurement of the ion beam current amount is preferably smaller than the number of times of the beam scanning where the object is scanned with the ion beam. For example, in the case where the entire of the object can be scanned N times, the number of times of the measurement by the beam measurement device 8 becomes N. However, in the case where the shape of the virtual ion implantation area 14 is not a rectangle having one side parallel to the ion beam scanning direction (for example, the case where the shape of the virtual ion implantation area 14 is a circle such as a wafer), the time when the area other than the virtual ion implantation area 14 is scanned is increased until the ion beam reaches the position of the beam measurement device 8, so that the efficiency of ion implantation is deteriorated. Therefore, the measurement of the ion beam current amount is not performed at each ion beam scan, but it is performed (N−1) times or less, so that the times of the measurement of the ion beam current amount may be reduced. Accordingly, for example, while performing feedback control based on the ion beam current amount, the time which is not contributed to the ion implantation can be reduced in comparison with the case of measuring the ion beam current amount for each ion beam scan, so that the efficiency of ion implantation can be improved. In addition, the accuracy of the ion implantation dose can be improved based on the measured ion beam current amount.

In addition, the measurement of the ion beam current amount is performed by a device arranged in the outer side of the object, for example, a side cup current measurement device. In other words, the device is arranged in the outer side from the area where the width of the object is largest in the ion beam scanning direction. Therefore, if the ion beam current amount is to be measured at the time when the area where the width of the object is smallest is scanned with the ion beam, since the time when the outer side of the object is scanned with the ion beam is increased, the efficiency of ion implantation is deteriorated. Therefore, in the above-described ion implantation method, ion beam current amount may be measured at the timing when the scanning is performed with the largest scanning amplitude among the available ion beam scanning amplitudes. Accordingly, the time when the outer side of the object is scanned with the ion beam is decreased.

In addition, the above-described ion implantation method may include a process of calculating a first control function for controlling the ion beam scanning with the largest scanning amplitude among the available ion beam scanning amplitudes and a process of calculating second control functions for controlling the ion beam scanning with a scanning amplitude other than the largest scanning amplitude based on the first control function.

The first control function is a function expressing, for example, the perturbation-added electric field 17 illustrated in FIG. 11, and in the process of calculating the first control function, the perturbation-added electric field 17 may be calculated based on, for example, a result of the measurement of the beam measurement device 8. In addition, the second control function is a function expressing the transformed perturbation-added electric field 19 illustrated in FIG. 11, and in the process of calculating the second control function based on the first control function, the transformed perturbation-added electric field 19 may be calculated, for example, only by transforming the function of the perturbation-added electric field 17 illustrated in FIG. 11 without particular measurement. In addition, for example, the ion beam scanning amplitude corresponding to the second control function is smaller than the scanning amplitude of the perturbation-added electric field 17.

Accordingly, if the first control function is calculated, the second control functions for controlling the ion beam which scans with the scanning amplitude other than the largest scanning amplitude can be easily calculated. In addition, a plurality of the second control functions may be calculated according to the magnitude of the corresponding scanning amplitude. In the above-described ion implantation method, the first control function and the second control functions may be a function representing a periodically-varying electric field or a periodically-varying magnetic field.

In addition, in the above-described ion implantation method, the first control function and the second control functions are a function expressing a time change in ion beam scanning (control) voltage; and if a difference between the maximum and minimum values of the control voltage of the first control function is denoted by $\Delta V1$ and a difference between the maximum and minimum values of the control voltage of the second control function is denoted by $\Delta V2$, the second control function satisfies $\Delta V2<\Delta V1$. In addition, the time (T_scan/2 illustrated in FIG. 11) taken for the control voltage of the second control function to be gradually decreased from the maximum value (V2 illustrated in FIG. 11) to the minimum value (V1 illustrated in FIG. 11) may be set so as to be equal to the period taken for the control voltage of the first control function to be gradually decreased from the maximum value (V_scan0) to the minimum value (−V_scan0). Accordingly, it is possible to change the ion beam scanning speed while allowing the ion beam scanning frequency to be maintained constant.

In addition, in the above-described ion implantation method, the process of calculating the first control function may be performed before the process of implanting the ions. Accordingly, it is possible to simplify control in the process of implanting the ions.

In addition, an ion implantation apparatus 100 according to another aspect is configured to include a semiconductor wafer retainer 10 as a holding unit which retains a wafer as an object, a beam scanner 5 as a scanning unit which is configured to scan a surface of the wafer with an ion beam, a wafer lifting device 12 as a movement unit which moves the semiconductor wafer retainer 10 in a direction intersecting an ion beam scanning direction, and a control unit 110 (refer to FIG. 2) which sets an ion beam scanning speed and a mechanical scanning speed of the object during ion implantation in advance and controls operations of the beam scanner 5 and the wafer lifting device 12 based on the set ion beam scanning speed and the set mechanical scanning speed of the object. While changing the ion beam scanning amplitude according to a surface outline of the object so that the ion beam scanning frequency (1/(T_scan)) is maintained constant, the control unit 110 controls the beam scanner 5 so that the ion beam scans at a predetermined scanning speed changing according to the scanning amplitude, and the control unit 110 controls the wafer lifting device 12 so as to move the object at the wafer scanning speed changing according to the ion beam scanning speed.

According to the aspect, without measurement of the ion beam current amount, the ion implantation dose can be maintained constant.

According to the ion implantation method and the ion implantation apparatus exemplified hereinbefore, it is possible to obtain the following effects. For example, in the hybrid scanning single-wafer processing type ion implantation apparatus, as the shape of the virtual planar ion implantation area, an ion implantation shape approximate to a polygonal shape having more vertexes than pentagon can be obtained. Particularly, as specific examples of the ion implantation shape, a shape approximate to a polygonal shape having more vertexes than a regular icosagon, a circular shape, a D-like shape, a drum-like shape, a star-like shape, a pseudo-pentagonal shape, or a pseudo-hexagonal shape can be obtained.

In addition, in the hybrid scanning single-wafer processing type ion implantation apparatus, the shape and area of the virtual planar ion implantation area can be controlled.

In addition, the shape and area of the virtual planar ion implantation area can be controlled without performing the measurement of the ion beam current value during the ion implantation.

In addition, the shape and area of the virtual planar ion implantation area can be controlled without changing the frequency of the scanning where the ion beam scans in one direction.

In addition, it is possible to control the shape and area of the virtual planar ion implantation area while allowing the ion implantation dose to be uniform over the entire surface of the semiconductor wafer.

In addition, the shape and area of the virtual planar ion implantation area can be controlled without stopping the ion implantation into the object. Particularly, in the case where the object is a semiconductor wafer, the shape and area of the semiconductor wafer ion implantation area can be controlled without stopping the semiconductor wafer scan. In addition, in the case of implanting ions into the semiconductor wafer, the semiconductor wafer can be continuously irradiated with the ion beam from the implantation start time to the implantation end time.

Hereinbefore, although the present invention is described with reference to the exemplary embodiments, the present invention is not limited to the embodiments, but appropriate combination or replacement of the components of the embodiments are included in the present invention. In addition, it will be understood by those skilled in the art that a combination of the embodiments, a rearrangement of a sequence of processes, an addition of a change such as various design modifications to the embodiments can be available, and embodiments added with the changes are also included in the scope of the present invention.

It should be understood that the invention is not limited to the above-described embodiment, but may be modified into various forms on the basis of the spirit of the invention. Additionally, the modifications are included in the scope of the invention.

Priority is claimed to Japanese Patent Application No. 2012-156935, filed Jul. 12, 2012, the entire content of which is incorporated herein by reference.

What is claimed is:

1. An ion implantation method, comprising:
    setting an ion beam scanning speed and a mechanical scanning speed of an object during ion implantation using hybrid scan in advance; and
    implanting ions based on the set ion beam scanning speed and the set mechanical scanning speed of the object,
    wherein, in the setting in advance,
    each of the ion beam scanning speeds is set based on each of ion beam scanning amplitudes which change severally according to a surface outline of the object to be irradiated with the ions so that an ion beam scanning frequency is maintained constant for any of ion beam scanning amplitudes, and the mechanical scanning speed of the object corresponding to the ion beam scanning speed is set so that an ion implantation dose per unit area to be implanted into the surface of the object is maintained constant.

2. The ion implantation method according to claim 1, further comprising measuring an ion beam current amount of the scanning ion beam at a predetermined timing during the ion beam scanning where the entire surface of the object is scanned with the ion beam, wherein the number of times of measurement of the ion beam current amount is smaller than the number of times of the ion beam scanning where the object is scanned with the ion beam.

3. The ion implantation method according to claim 2, wherein the ion beam current amount of the scanning ion beam is measured at timing when the ion beam scanning is performed with the largest ion beam scanning amplitude among the available ion beam scanning amplitudes.

4. The ion implantation method according to claim 1, comprising:
    calculating a first control function of the ion beam scanning for controlling the ion beam which scans with the largest scanning amplitude among available ion beam scanning amplitudes; and
    calculating second control functions of the ion beam scanning for controlling the ion beam which scans with a scanning amplitude other than the largest scanning amplitude based on the first control function.

5. The ion implantation method according to claim 4, wherein the first control function is a function representing a periodically-varying electric field or a periodically-varying magnetic field.

6. The ion implantation method according to claim 4,
    wherein the first control function and the second control function represent a time change in ion beam scanning voltage, and
    wherein, when a difference between maximum and minimum values of the ion beam scanning voltage of the first control function is defined by $\Delta V1$ and a difference between maximum and minimum values of the ion beam scanning voltage of the second control function is defined by $\Delta V2$, the second control function is set to satisfy $\Delta V2 < \Delta V1$ and to satisfy that a period taken for the ion beam scanning voltage of the second control function to be changed from the maximum value to the minimum value is equal to a period taken for the ion beam scanning voltage of the first control function to be changed from the maximum value to the minimum value.

7. The ion implantation method according to claim 4, wherein the calculating the first control function is performed before the implanting of the ions.

8. The ion implantation method according to claim 1, wherein the object is a semiconductor wafer.

9. An ion implantation method comprising:
    setting an ion beam scanning speed and a mechanical scanning speed of an object during ion implantation using hybrid scan in advance; and
    implanting ions based on the set ion beam scanning speed and the set mechanical scanning speed of the object,
    wherein, in the setting in advance,
    each of the ion beam scanning speeds is set based on each of ion beam scanning amplitudes which changes severally according to a surface outline of the object to be irradiated with the ions so that an ion beam scanning frequency is maintained constant for any of ion beam scanning amplitudes,
    wherein, in the implanting,
    measuring an current amount of the scanning ion beam at a predetermined timing during the ion beam scanning where the entire surface area of the object is scanned with the ion beam, and
    wherein, the implanting of the ions is performed so that the number of times of measurement of the ion beam current amount is smaller than the number of times of the ion beam scanning where the object is scanned with the ion beam.

10. An ion implantation apparatus comprising:
    a holding unit which retains an object;
    a scanning unit which is configured to scan a surface of the object with an ion beam;
    a movement unit which moves the holding unit in a direction intersecting an ion beam scanning direction; and
    a control unit which sets an ion beam scanning speed and a mechanical scanning speed of the object during ion implantation in advance and controls operations of the scanning unit and the movement unit based on the set ion beam scanning speed and the set mechanical scanning speed,
    wherein, while changing each ion beam scanning amplitude according to a surface outline of the object so that an ion beam scanning frequency is maintained constant for any of ion beam scanning amplitudes, the control unit controls the scanning unit so that the ion beam scans at a predetermined scanning speed changing according to each scanning amplitude, and wherein the control unit controls the movement unit so as to move the object at the mechanical scanning speed changing according to the ion beam scanning speed.

\* \* \* \* \*